(12) United States Patent
Potterf et al.

(10) Patent No.: US 11,916,374 B2
(45) Date of Patent: Feb. 27, 2024

(54) FAULT MANAGED POWER SYSTEM

(71) Applicant: Cisco Technology, Inc., San Jose, CA (US)

(72) Inventors: Jason Dewayne Potterf, Austin, TX (US); Chad M. Jones, Doylestown, OH (US); Joel Richard Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 56 days.

(21) Appl. No.: 17/562,464

(22) Filed: Dec. 27, 2021

(65) Prior Publication Data

US 2023/0040876 A1 Feb. 9, 2023

Related U.S. Application Data

(60) Provisional application No. 63/232,817, filed on Aug. 13, 2021, provisional application No. 63/229,605, filed on Aug. 5, 2021.

(51) Int. Cl.
*H02H 7/26* (2006.01)
*G01R 31/52* (2020.01)
(Continued)

(52) U.S. Cl.
CPC .............. *H02H 7/26* (2013.01); *G01R 31/52* (2020.01); *G06F 1/266* (2013.01); *H04B 3/54* (2013.01); *H04L 12/10* (2013.01); *H04L 25/08* (2013.01)

(58) Field of Classification Search
CPC ....... H04L 12/10; H02J 13/0004; H02J 13/00; G01R 31/086; G01R 31/08; G01R 31/088; H02H 7/261
See application file for complete search history.

(56) References Cited

U.S. PATENT DOCUMENTS 7,566,987 B2 7/2009 Black et al.
8,068,937 B2 11/2011 Eaves
(Continued)

FOREIGN PATENT DOCUMENTS

WO 2020227045 A1 11/2020
WO WO-2022081778 A1 * 4/2022

OTHER PUBLICATIONS

Curtis, Paul et al., "EMI Reduction Technique, Dual Random Spread Spectrum", Texas Instruments Application note, Jun. 2020 ( Year: 2020).*

(Continued)

*Primary Examiner* — Ryan Johnson
(74) *Attorney, Agent, or Firm* — Edell, Shapiro & Finnan, LLC

(57) ABSTRACT

A system is provided that includes a power transmitter configured to provide power to a current loop, a power receiver configured to receive the power from the current loop. The power receiver is configured to, on a periodic basis, disconnect from the current loop to stop pulling power from the current loop for a period of time to enable a safety check to be performed by the power transmitter. The power transmitter is configured to: monitor current on the current loop; determine whether a current level on the current loop passes the safety check within a predetermined time interval since a determination that the current level was not within a safe range; and control connectivity of the power to the current loop depending on whether the safety check has or has not passed within the predetermined time interval.

20 Claims, 16 Drawing Sheets

(51) Int. Cl.
*G06F 1/26* (2006.01)
*H04B 3/54* (2006.01)
*H04L 12/10* (2006.01)
*H04L 25/08* (2006.01)

(56) References Cited

U.S. PATENT DOCUMENTS

| | | |
|---|---|---|
| 8,638,008 B2 | 1/2014 | Baldwin et al. |
| 8,768,528 B2 | 7/2014 | Millar et al. |
| 8,781,637 B2 | 7/2014 | Eaves |
| 9,184,795 B2 | 11/2015 | Eaves |
| 9,419,436 B2 | 8/2016 | Eaves et al. |
| 9,853,689 B2 | 12/2017 | Eaves |
| 9,893,521 B2 | 2/2018 | Eaves |
| 10,263,526 B2 | 4/2019 | Sandusky et al. |
| 10,468,879 B2 | 11/2019 | Eaves |
| 10,541,543 B2 | 1/2020 | Eaves |
| 10,714,930 B1 | 7/2020 | Weiss et al. |
| 10,735,105 B2 | 8/2020 | Goergen et al. |
| 10,790,997 B2 | 9/2020 | Jones et al. |
| 11,061,456 B2 | 7/2021 | Jones et al. |
| 11,063,630 B2 | 7/2021 | Arduini et al. |
| 2007/0011547 A1 | 1/2007 | Karam |
| 2010/0045302 A1 | 2/2010 | Karam |
| 2013/0103220 A1 | 4/2013 | Eaves |
| 2015/0372826 A1 | 12/2015 | Blaut et al. |
| 2016/0142217 A1 | 5/2016 | Gardner et al. |
| 2016/0294500 A1 | 10/2016 | Chawgo et al. |
| 2016/0294568 A1 | 10/2016 | Chawgo et al. |
| 2017/0229886 A1 | 8/2017 | Eaves |
| 2018/0098201 A1 | 4/2018 | Torello et al. |
| 2018/0123360 A1 | 5/2018 | Eaves |
| 2018/0313886 A1 | 11/2018 | Mlyniec et al. |
| 2019/0097457 A1 | 3/2019 | Hazani |
| 2019/0280895 A1 | 9/2019 | Mather et al. |
| 2020/0235949 A1 | 7/2020 | Jones et al. |
| 2020/0295955 A1 | 9/2020 | O'Brien et al. |
| 2020/0326764 A1 | 10/2020 | Goergen et al. |
| 2020/0389329 A1 | 12/2020 | Jones et al. |
| 2021/0266188 A1 | 8/2021 | Goergen et al. |
| 2022/0190587 A1 | 6/2022 | Eaves et al. |

OTHER PUBLICATIONS

Tech Web, "Isolated Flyback Converter Basics: What is Switching AC-DC Conversion?", Jan. 6, 2016, retrieved from https://techweb.rohm.com/product/power-ic/acdc/acdc-design/846/ on Aug. 22, 2023 (Year: 2016).*

*Voltserver Inc.*, v. *Cisco Technology, Inc.*, "Decision Denying Institution of Post-Grant Review," United States Patent and Trademark Office, PGR2021-00055, U.S. Pat. No. 10,735,105 B2, Aug. 19, 2021, 25 pages.

*Voltserver Inc.*, v. *Cisco Systems, Inc.*, "Patent Owner's Preliminary Response to Post Grant Review Under 35 U.S.C. § 312 and 37 C.F.R. § 42.107," United States Patent and Trademark Office, PGR2021-00055, U.S. Pat. No. 10,735,105, 2021, Jun. 2, 2021, 51 pages.

"Effects of current on human beings and livestok—Part 1: General aspects," Technical Specification, Basic Safety Publication, IEC/TS 60479-1, Edition 4.0, Jul. 2005, 122 pages.

"Information technology equipment—Safety—Part 1: General requirements," International Standard, IEC 60950-1, Edition 2.2, May 2013, pp. 1-61, 63 pages.

"Information technology equipment—Safety—Part 1: General requirements," International Standard, IEC 60950-1, Edition 2.2, May 2013, pp. 62-122, 61 pages.

"Information technology equipment—Safety—Part 1: General requirements," International Standard, IEC 60950-1, Edition 2.2, May 2013, pp. 123-181, 59 pages.

"Information technology equipment—Safety—Part 1: General requirements," International Standard, IEC 60950-1, Edition 2.2, May 2013, pp. 182-253, 72 pages.

"Information technology equipment—Safety—Part 1: General requirements," International Standard, IEC 60950-1, Edition 2.2, May 2013, pp. 254-319, 66 pages.

"Information technology equipment—Safety—Part 1: General requirements," International Standard, IEC 60950-1, Edition 2.2, May 2013, pp. 320-377, 58 pages.

"Information technology equipment—Safety—Part 1: General requirements," International Standard, IEC 60950-1, Edition 2.2, May 2013, pp. 378-433, 56 pages.

"Information technology equipment—Safety—Part 1: General requirements," International Standard, IEC 60950-1, Edition 2.2, May 2013, pp. 434-490, 57 pages.

"Information technology equipment—Safety—Part 1: General requirements," International Standard, IEC 60950-1, Edition 2.2, May 2013, pp. 491-551, 61 pages.

"Information technology equipment—Safety—Part 1: General requirements," International Standard, IEC 60950-1, Edition 2.2, May 2013, pp. 552-622, 71 pages.

"Information technology equipment—Safety—Part 1: General requirements," International Standard, IEC 60950-1, Edition 2.2, May 2013, pp. 623-644, 24 pages.

"Low-voltage switchgear and controlgear—Part 1: General rules," International Standard, Amendment 2, IEC 60947-1, Edition 5.0, Sep. 2014, pp. 1-63, 65 pages.

"Low-voltage switchgear and controlgear—Part 1: General rules," International Standard, Amendment 2, IEC 60947-1, Edition 5.0, Sep. 2014, pp. 64-102, 41 pages.

Stephen Edelstein, "Updated 2016 Tesla Model S also gets new 75-kWhbattery option," Internet Archive WayBack Machine, Green Car Reports, May 5, 2016, 3 pages.

Stephen S. Eaves, "Network Remote Powering using Packet Energy Transfer," IEEE Xplore, Proceedings of IEEE International Conference on Telecommunications Energy (INTELEC) 2012, 978-1-4673-1000, Sep. 30-Oct. 4, 2012, 4 pages.

"Audio/video, information and communication technology equipment—Part 1: Safety requirements," International Standard, IEC 62368-1, Edition 2.0, Feb. 2014, pp. 1-132, 134 pages.

"Audio/video, information and communication technology equipment—Part 1: Safety requirements," International Standard, IEC 62368-1, Edition 2.0, Feb. 2014, pp. 133-263, 131 pages.

"Audio/video, information and communication technology equipment—Part 1: Safety requirements," International Standard, IEC 62368-1, Edition 2.0, Feb. 2014, pp. 264-387, 124 pages.

"Audio/video, information and communication technology equipment—Part 1: Safety requirements," International Standard, IEC 62368-1, Edition 2.0, Feb. 2014, pp. 388-508, 121 pages.

"Audio/video, information and communication technology equipment—Part 1: Safety requirements," International Standard, IEC 62368-1, Edition 2.0, Feb. 2014, pp. 509-593, 85 pages.

"Audio/video, information and communication technology equipment—Part 1: Safety requirements," International Standard, IEC 62368-1, Edition 2.0, Feb. 2014, pp. 594-676, 85 pages.

"National Electrical Code," National Fire Protection Association (NFPA) 70, 2017, 881 pages.

*Voltserver Inc.*, v. *Cisco Technology, Inc.*, "Declaration of David A. Durfee, Ph.D.," United States Patent and Trademark Office, PGR2021-00055, Patent No. 10,735, 105, Feb. 16, 2021, 340 pages.

Adel S. Sedra, "Microelectronic Circuits," Sedra/Smith, Oxford University Press, Seventh Edition, 2015, 38 pages.

Charles k. Alexander, et al., "Fundamentals of Electric Circuits," McGraw Hill Education, Indian Edition 5e, 2013, 37 pages.

Andrew S. Tanenbaum, "Computer Networks," Prentice Hall PTR, Third Edition, 1996, 12 pages.

William Stallings, "Data and Computer Communications," Macmillan Publishing Company, Fourth Edition, 1994, 14 bages.

B.P. Lathi, et al., "Modern Digital and Analog Communication Systems," Oxford University Press, Fourth Edition, 2009, 15 pages.

*Voltserver Inc.*, v. *Cisco Technology, Inc.*, "Petition for Post Grant Review of U.S. Pat. No. 10,735,105," United States Patent and Trademark Office, PGR2021-00055, U.S. Pat. No. 10,735,105, Feb. 16, 2021, 132 pages.

(56) References Cited

OTHER PUBLICATIONS

Stephen H. Hall, et al., "High-Speed Digital System Design: A handbook of Interconnect Theory and Design Practices,", John Wiley & Sons, Inc., 2000, 55 pages.

"Understanding 802.3at, PoE Plus Standard Increases Available Power," Microsemi, Jun. 2011, 7 pages.

"Digital Electricity Gen2 Detailed Installation Manual," Voltserver Digital Electricity, Rev B.1, Nov. 29, 2017, 68 pages.

Berkeley Lab ETA, "Touch-Safe, High Voltage Digital Electricity Transmission using Packet Energy Transfer," Vimeo, https://vimeo.com/172469008, Mar. 8, 2016, 8 pages.

*Voltserver Inc.*, v. *Cisco Technology, Inc.*, "Decision Denying Institution of Post-Grant Review," United States Patent and Trademark Office, PGR2021-00056, U.S. Pat. No. 10,735,105 B2, Aug. 23, 2021, 18 pages.

*Voltserver Inc.*, v. *Cisco Systems, Inc.*, "Patent Owner's Preliminary Response to Post Grant Review Under 35 U.S.C. § 312 and 37 C.F.R. § 42.107," United States Patent and Trademark Office, PGR2021-00056, U.S. Pat. No. 10,735,105, 2021, Jun. 2, 2021, 46 pages.

*Voltserver Inc.*, v. *Cisco Technology, Inc.*, "Declaration of Stephens S. Eaves," United States Patent and Trademark Office, PGR2021-00056, U.S. Pat. No. 10,735,105, Feb. 16, 2021, 7 pages.

"Electrical—Computer Conference Proceedings," Internet Archive WayBack Machine Search for Intelec 2012, Curran Associates, Inc., http://www.proceedings.com/electrical-computer-proceedings.html, 2012, 125 pages.

"Part VII: A Summary of Commonly Used Mar. 21 Fields," Marc, Understanding MARC, https://www.loc.gov/marc//umb/um07to10.html, retrieved from Internet Feb. 13, 2021, 17 pages.

LC Catalog-Browse, https://catalog.loc.gov/vwebv/searchBrowse, retrieved from the Internet Feb. 12, 2021, 1 page.

"International Telecommunications Energy Conference: [proceedings] (Marc Tags)," Library Catalog, https://catalog.loc.gov/vwebv/staffView?searchId=3877&recPointer=0&recCount=25&searchType=1&bibId=11348322, retrieved from the Internet Feb. 12, 2021, 3 pages.

*Voltserver Inc.*, v. *Cisco Technology, Inc.*, "Petition for Post Grant Review of U.S. Pat. No. 10,735,105," United States Patent and Trademark Office, PGR2021-00056, U.S. Pat. No. 10,735,105, Feb. 16, 2021, 116 pages.

"International Telecommunications Energy Conference: [proceedings] (Full Record)," Library Catalog, https://catalog.loc.gov/vwebv/holdingsInfo?searchId=3810&recPointer=0&recCount=25&searchType=1&bibId=11348322, retrieved from the Internet Feb. 12, 2021, 4 pages.

International Search Report and Written Opinion in counterpart International Application No. PCT/US2022/038819, dated Nov. 15, 2022, 15 pages.

* cited by examiner

US 11,916,374 B2

FAULT MANAGED POWER SYSTEM

CROSS REFERENCE TO RELATED APPLICATIONS

This application claims priority to U.S. Provisional Application No. 63/232,817, filed Aug. 13, 2021, and to U.S. Provisional Application No. 63/229,605, filed Aug. 5, 2021. The entireties of each of these applications are incorporated herein by reference.

TECHNICAL FIELD

The present disclosure relates to power fault management for electronic devices, such as networking equipment and computing equipment, as well as building technologies, such as heating ventilation and air conditioning (HVAC), lighting systems and appliances.

BACKGROUND

A power fault occurs in an electrical device when an abnormal electrical current occurs, often as a result of a short-circuit. A fault may also occur as a result of human contact with the circuit, or an open-circuit. A fault managed power scheme is a mechanism by which an electrical device manages a situation when a power fault situation occurs.

DESCRIPTION OF EXAMPLE EMBODIMENTS

Overview

Figure 1A:
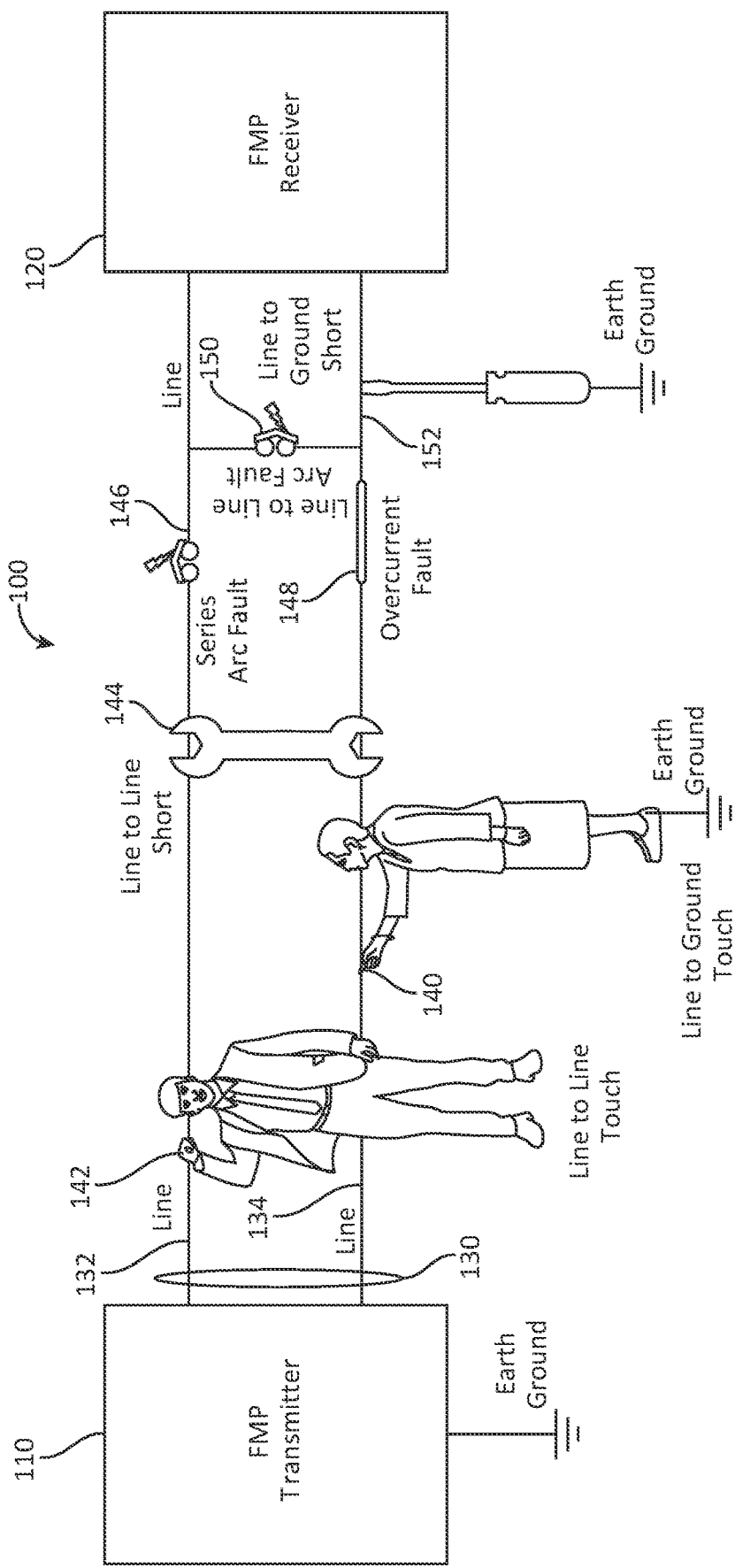
FIG. 1A is a block diagram of an example system that includes a fault managed power (FMP) transmitter and an FMP receiver, and in which the techniques presented herein may be used according to an example embodiment.

Presented herein are techniques for power fault management that operate without power-source-side switching. According to one aspect, a system is provided that includes a power transmitter configured to provide power to a current loop, a power receiver configured to receive the power from the current loop. The power receiver is configured to, on a periodic basis, disconnect from the current loop to stop pulling power from the current loop for a period of time to enable a safety check to be performed by the power transmitter. The power transmitter is configured to: monitor current on the current loop; determine whether a current level on the current loop passes the safety check within a predetermined time interval since a determination that the current level was not within a safe range; and control connectivity of the power to the current loop depending on whether the safety check has or has not passed within the predetermined time interval.

According to still another aspect, a system is provided comprising an alternating current to direct current (AC-DC) conversion circuit coupled to an AC power supply that converts AC power to DC power; a plurality of power transmitters, each configured to output power to a corresponding current loop of a plurality of current loops. Each power transmitter is configured to determine whether a current level on the corresponding current loop passes a safety check within a predetermined time interval since a determination that the current level was not within a safe range, and to control connectivity of power to the corresponding current loop depending on whether the safety check has or has not passed within the predetermined time interval. The system further includes a plurality of isolation circuits each of which is coupled between the AC-DC conversion circuit and a respective one of the plurality of power transmitters; and a plurality of power receivers, each coupled to a corresponding current loop of the plurality of current loops, wherein each power receiver is configured to, on a periodic basis, disconnect from the corresponding current loop to stop pulling power from the corresponding current loop for a period of time to enable a safety check to be performed by the power transmitter.

According to still another aspect, a system is provided that includes an alternating current to direct current (AC-DC) conversion circuit coupled to an AC power supply that converts AC power to DC power; a plurality of power transmitters, each configured to output power to a corresponding current loop of a plurality of current loops, wherein each power transmitter is configured to determine whether a current level on the corresponding current loop passes a safety check within a predetermined time interval since a determination that the current level was not within a safe range, and to control connectivity of power to the corresponding current loop depending on whether the safety check has or has not passed within the predetermined time interval; and a plurality of isolation circuits each of which is coupled between the AC-DC conversion circuit and a respective one of the plurality of power transmitters.

Example Embodiments

Techniques are presented herein for fault detection in a system by which a power source device, also called a Power Sourcing Equipment (PSE) in Power of Ethernet (PoE) terminology, supplied power over a cable, such as an Ethernet data cable (or more generally a current loop), to a Powered Device (PD) in PoE terminology.

One power fault management mechanism involves utilizing a synchronous local and remote switching scheme that ensures transmission line integrity by periodically isolating a power line on both ends and evaluating the rate of charge drain from the line through a known resistance. The synchronous scheme has the drawback that it requires the power transmitter and the power receiver to be synchronized, which is an additional implementation burden. The techniques presented herein do not require synchronization between the power transmitter and power receiver.

FIG. 1A shows an example system 100 that includes a fault managed power (FMP) transmitter 110 and an FMP receiver 120. The FMP transmitter 110 provides power to the FMP receiver 120 via a current loop 130 that includes (sending) line 132 and (returning) line 134. The various possible faults that could occur are shown in FIG. 1A, and include a line-to-ground fault 140, a line-to-line touch fault 142, a line-to-line short 144, a series arc fault 146, an overcurrent fault 148, a line-to-line arc fault 150, and a line-to-ground short 152. The current loop 130 may be contained within a cable, but that is not shown in FIG. 1A, for simplicity.

As described further below, the FMP transmitter 110 is configured to provide power to a current loop 130. The FMP receiver 120 is configured to receive the power from the current loop 130 and in particular, the FMP receiver 120 is configured to, on a periodic basis, disconnect from the current loop 130 to stop pulling power from current loop for a period of time to enable a safety check to be performed by the FMP transmitter 110. The FMP transmitter 110 is configured to monitor current on the current loop 130 to determine whether the current level on the current loop passes the safety check within a predetermined time interval since a determination that the current level was not within a safe range. The FMP transmitter 110 is configured to control connectivity of the power to the current loop 130 depending on whether the safety check has or has not passed within the predetermined time interval. More specifically, the FMP transmitter 110 is configured to determine whether the current level passes the safety check by determining whether the current level is less than a predetermined safety threshold corresponding to the safe range, and declaring the safety check passes when the current level is less than the predetermined safety threshold.

The use of the term "current loop" here is not meant to be limiting. In some cases, a current loop could include a transmission line (line pair that includes two conductors—a send line and a return line) or it could refer to a configuration/environment in which a return path of the current loop is on a grounding conductor that is not one of the two lines of a line pair.

Figure 1B:
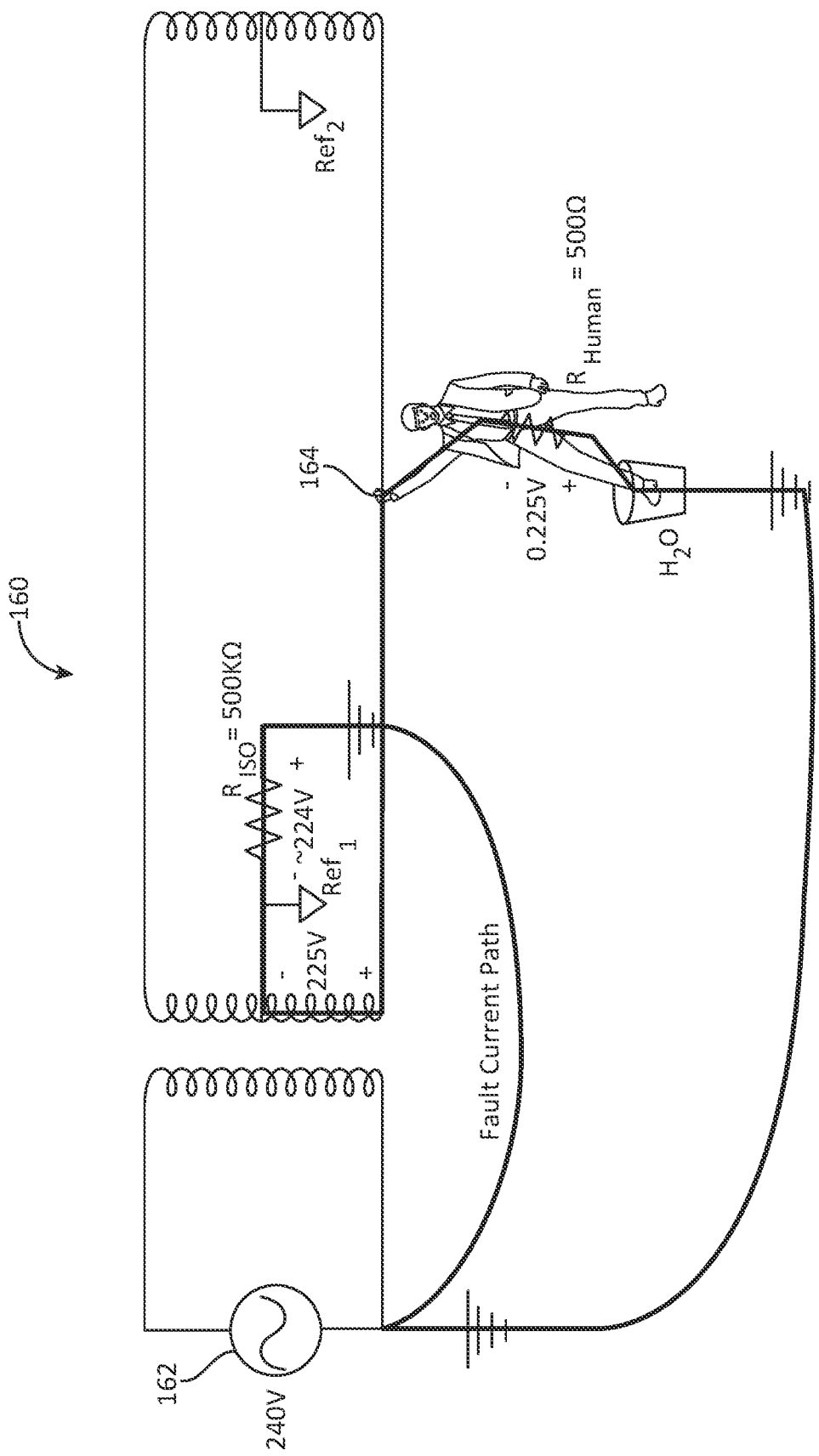
FIG. 1B is a schematic diagram showing a technique used to reduce the apparent voltage and resultant fault current at a human touch fault location to further reduce a line-to-ground fault, according to an example embodiment.

Reference is now made to FIG. 1B, which shows a power transmitter 160 that includes a power source 162 and an impedance $R_{ISO}$ that is connected between reference voltage ($Ref_1$) of an isolated transmission line and earth ground. Line-to-ground faults can be substantially limited by careful selection of the impedance $R_{ISO}$ (e.g., 500 k ohms). An impedance sufficient to reduce the apparent voltage and resultant fault current at a human touch fault location, shown at 164, below the system's nominal operating voltage can further reduce a line-to-ground fault's required response time according to safety limits.

The system should have sufficient safety tolerance to ensure fault currents never exceed the electrical shock limits of the appropriate safety standard governing such systems in any condition. Setting the expected current to show safety to absolute zero current draw from the source, while ideal, is impractical to expect due to factors such as circuit leakage, cable leakage, measurement noise, etc. Therefore a current limit slightly above zero, but well below the shock limits should be chosen.

The fundamental theory of safety in systems, such as system 100, is that all current paths are known. Should current take a path other than through a valid load, that current is also detectable, and appropriate action can be taken. Current path integrity is a secondary factor, which includes series arcing and high resistance connections. The power fault management techniques presented herein are focused on the primary current path problem.

In order to determine that the current leaving the source and entering the load are equal, the currents need to be either measured in real-time, or revert to a known quantity on a regular basis.

Published journal articles from nearly 20 years ago describe efforts to do this through real-time measurement and communication of this value back to the source at a regular interval. Such systems were proposed as safety enhancements during the emergence of remote-powered Digital Subscriber Line (DSL) Access Multiplexers, but did not achieve wide usage outside of the telecommunications outside plant.

One technique accounts for unexpected current paths by reverting the system to a known current state. That technique does this by isolating the load, and then immediately isolating the source. This leaves the transmission line in a charged state, and depending on the characteristics of the cable, one can predict the current through the cable into a known resistance and detect abnormal discharge current curves.

The approach presented herein also reverts the system to a known current state. By isolating the load (power receiver) but leaving the source (power transmitter) connected, the cable (current loop) remains charged to full voltage at all times. However, isolating the load reverts the current drawn on the current loop to zero. Any current beyond a very low safety threshold above and below zero, on either transmission line of the current loop, in this state is indicative of a fault. If the current is present on only one line, it is a line-to-ground or line-to-other circuit fault. If the current is present and equal on both lines, it is a line-to-line fault. If the relevant safety standards allow it, different thresholds can be used for line-to-line faults and line-to-ground faults during this near-zero current load-isolated state.

Line-to-ground faults can also be detected in this scheme during unknown current states by simply comparing the current on both lines. This ensures faster shutdown for the more common line-to-ground faults. This differential trip threshold represents a third possible safety threshold and may differ from the previously introduced safety thresholds.

The techniques presented herein have many advantages. The safety critical measurement is a comparison of the line current to zero, and does not need to change as the system load changes. This allows for the establishment of a high precision threshold that can be implemented in either hardware or software, provided it is coordinated with the timing parameters of the remote load's isolation switches.

As described further below, the method involves, at a power transmitter that provides power over a current loop to a power receiver, coupling power to the current loop for transport to a power receiver. The power transmitter monitors current on the current loop. The power transmitter determines whether the current level on the current loop passes a safety check within a predetermined time interval since a previous determination that the current level was not within a safe range, and controls connectivity of the power to the current loop depending on whether the safety check has or has not passed within the predetermined time interval.

The power receiver receives power from the current loop. On a periodic basis, the power receiver disconnects from the current loop to stop pulling current from the current loop for a period of time. The power transmitter and power receiver are not coordinating their behaviors—they are operating asynchronously in this regard. The power transmitter, on a recurring basis, determines whether the current on the current loop exhibits a predetermined pattern (indicative of safe conditions on the current loop) and controls connectivity of the power to the current loop based on whether current on the current loop does or does not exhibit the predetermined pattern.

Figure 2:
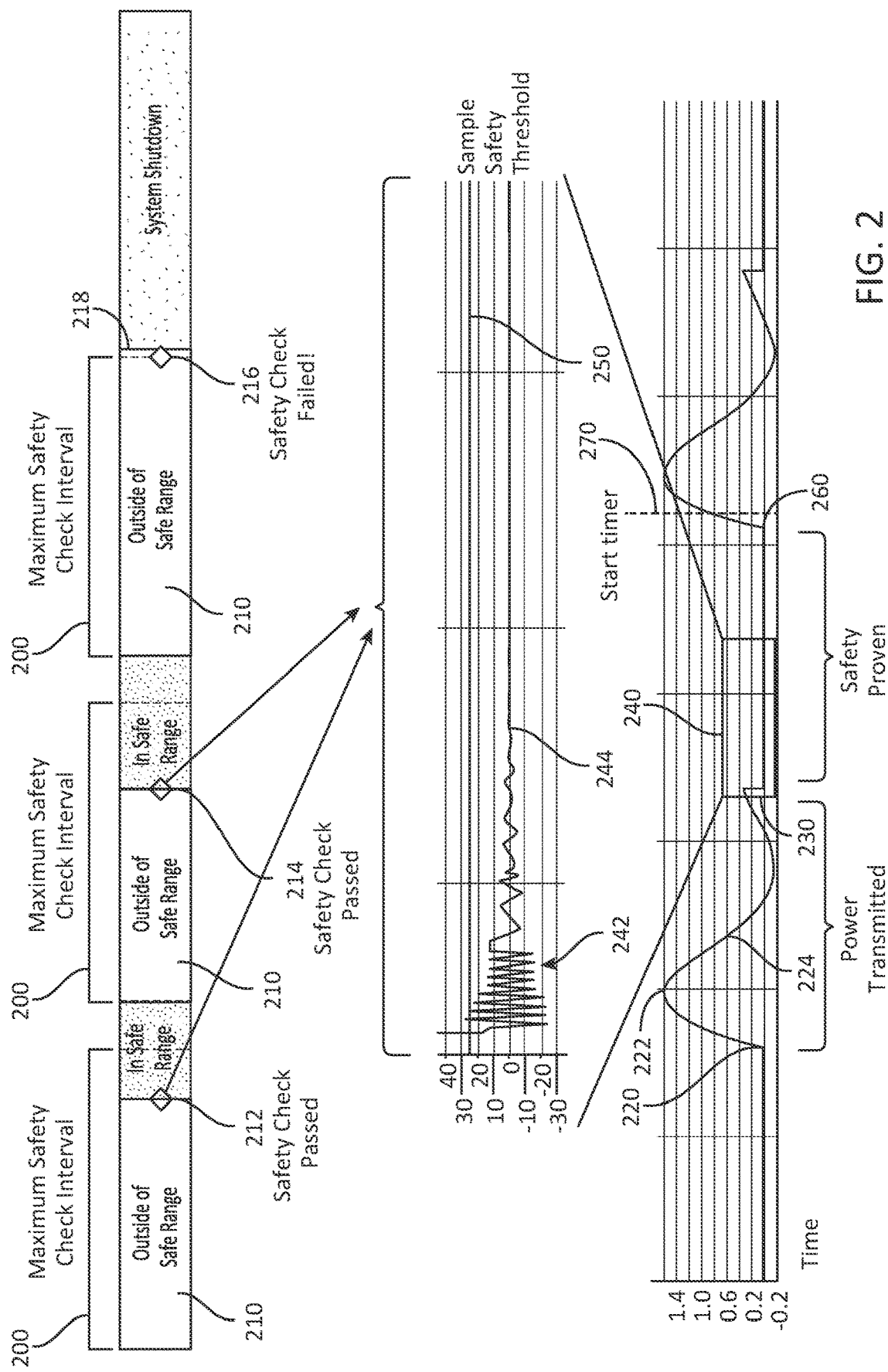
FIG. 2 is a timing diagram that depicts various phases of a fault managed power method in which a power transmitter and power receiver operate asynchronously, according to an example embodiment.

Reference is now made to FIG. 2 to describe this operation in more detail. FIG. 2 shows a timing diagram that depicts various phases of a fault managed power method where the power transmitter and power receiver are operating asynchronously. A maximum safety check interval 200 is defined as the longest period of time allowed before the power receiver needs to prove that it is safe, that is, that there are no faults on the current loop between the power transmitter and power receiver. As shown at 210, there is a sub-interval of time during the maximum safety check interval 200 when the power receiver is connected to the current loop and power is being transmitted over the current loop to the power receiver. During this sub-interval of time the system is outside the safe range because, again, power is being transmitted on the current loop to the power receiver. At some point prior to the end of the maximum safety check interval 200, the power transmitter is expecting the power receiver to disconnect from the current loop so that the power transmitter can measure current on the current loop, once the power receiver has disconnected and stopped pulling current from the current loop, in order to detect a potential fault on the current loop. For example, as shown at 212 and 214, the power receiver disconnects from the current loop and the power transmitter measures the current on the current loop and determines that there are no line-to-line faults (the system is safe). However, at 216, the maximum safety check interval 200 expires without the power receiver having disconnected from the current loop to demonstrate safety. Consequently, the power transmitter would at least temporarily "shut down" at 218 by disconnecting the power from the current loop so that no current is transmitted over the current loop to the power receiver. This occurs because the power transmitter could no longer observe the conditions of the current loop (when the power receiver stops pull current from the current loop) in order to check for any faults on the current loop.

The safety check operation is now described in more detail. The power transmitter expects that at some point in time during a maximum safety check interval 200, the power receiver will disconnect from the current loop so that the power transmitter can measure conditions on the current loop while the power receiver is not pulling current. First, when the power transmitter starts transmitting power over the current loop as shown at 220, the power goes up, but not necessarily in a straight line up (due to inductance of the current loop in the cable) and it rises up to the full current shown at 222. When the load at the power receiver gets enough current to do what it needs, it will slow down its pull of current as shown at 224 and then it perhaps levels out as shown in FIG. 2.

At 230, the power receiver disconnects from the current loop to allow the safety check to be performed. This starts a safety check interval 240 during which the power receiver stops pulling current. When the power receiver first disconnects from the current loop, there will be some ringing as shown at 242 until the current settles as shown at 244. A comparison is made between the level of the current during these conditions (with the power receiver disconnected from the current loop) with the safety threshold 250. If there is a fault, the current would not go below the safety threshold 250 because the current would be going through someone or something. Conversely, if the current settles to a value that is below the safety threshold 250 (and stays below the safety threshold 250 for a period of time), then safety has been proven for the system insofar as a line-to-line fault does not exist. This means, that the current on the current loop is not flowing somewhere it should not. The power receiver can reconnect to the current loop allowing the power transmitter to transmit power over the current loop to the power receiver. This is shown at 260. The process repeats at the next occurrence of a safety check.

The maximum safety check interval 200 corresponds to a maximum amount of time that electrical current flowing into a fault presents a shock or fire hazard. It is the longest period of time that the system allows before it needs to prove safety. If safety cannot be proven (the current on the current loop does not go below the safety threshold for any reason) prior to the end of the maximum safety check interval 200, the power transmitter shuts down power transmission over the current loop. On the other hand, the power transmitter resets a timer (corresponding to the maximum safety check interval) after the current on the current loop has gone above the safety threshold, as shown in FIG. 2. This timer starts at 270 as shown in FIG. 2.

This method does not require switching of the current source (at the power transmitter) during normal conditions. The current source does use a circuit-breaking element, but it is only actuated in a fault condition. Also, because the current source does not isolate itself, it does not require synchronization between the source and load isolation switching timing profiles. Thus, the only timing requirement is that the remote load (power receiver) reduces its current draw to zero by isolating itself for a minimum off time, with a maximum period of isolating events set by appropriate safety limits for shock energy exposure. The power receiver can independently choose when it isolates itself, and for how long, as long as it adheres to the safety limits. The current source monitors the circuit's current draw, and if these safety limits are violated, the circuit-breaking element is engaged to disconnect power transmission over the current loop.

This flexibility also allows the remote load (power receiver) to be load level adaptive and operate with longer safety intervals during periods of light load. Further, this flexibility can be used to counter electromagnetic compatibility/electromagnet interference (EMC/EMI) risks as periodic sources of EMI can be avoided, and EMC can be reduced by dithering the safety check intervals on a given transmission line to avoid periodic elements, as described further below.

The hardware to implement this method may be substantially similar to that used the above-noted prior methods. This means that a single system could be built that can economically achieves both methods of safety validation. This could be used to allow an adaptive system based on the cabling characteristics as automatically determined in the field. A cable with high inductance might prefer the prior mode, but a system with excessive capacitance may be better suited for the techniques presented herein. Also, depending on the governing safety standards safety limits, one method may be able to meet regulatory requirements more easily than the other, motivating their simultaneous use. These methods could be used concurrently by alternating between them, with the transmitter disconnecting every other safety period, and the receiver disconnecting during every safety period. A higher frequency of operation may aid in meeting safety limits in this concurrent mode.

The current source monitor can also evaluate the current waveforms for high frequency events which are indicative of arcing events, both in series and in parallel to the transmission line and load. These detection methods are well established for devices such as Arc Fault Circuit Interrupters and regulated by relevant Underwriters Laboratory (UL) standards. See UL 1699 and UL 1699B for AC AFCI and DC AFCI, respectively.

Further, the system chooses near-zero current as the baseline current out of convenience. Other currents are equally valid for use during fault detection intervals, subject to a similar safety tolerance. In coordination with the remote load, the load can draw known currents and measure the voltage drop at the far end under the known current draw. A simultaneous measurement of the source voltage can be coordinated via any appropriate means, such as a preset schedule, digital or analog communication, etc. to establish the resistance of the current loop. Such a measurement can be made at the start of operation, and then periodically during normal operation. If a change in resistance indicative of a high resistance connection is detected by this method, the system can shutdown to prevent a fire hazard.

Figure 3:
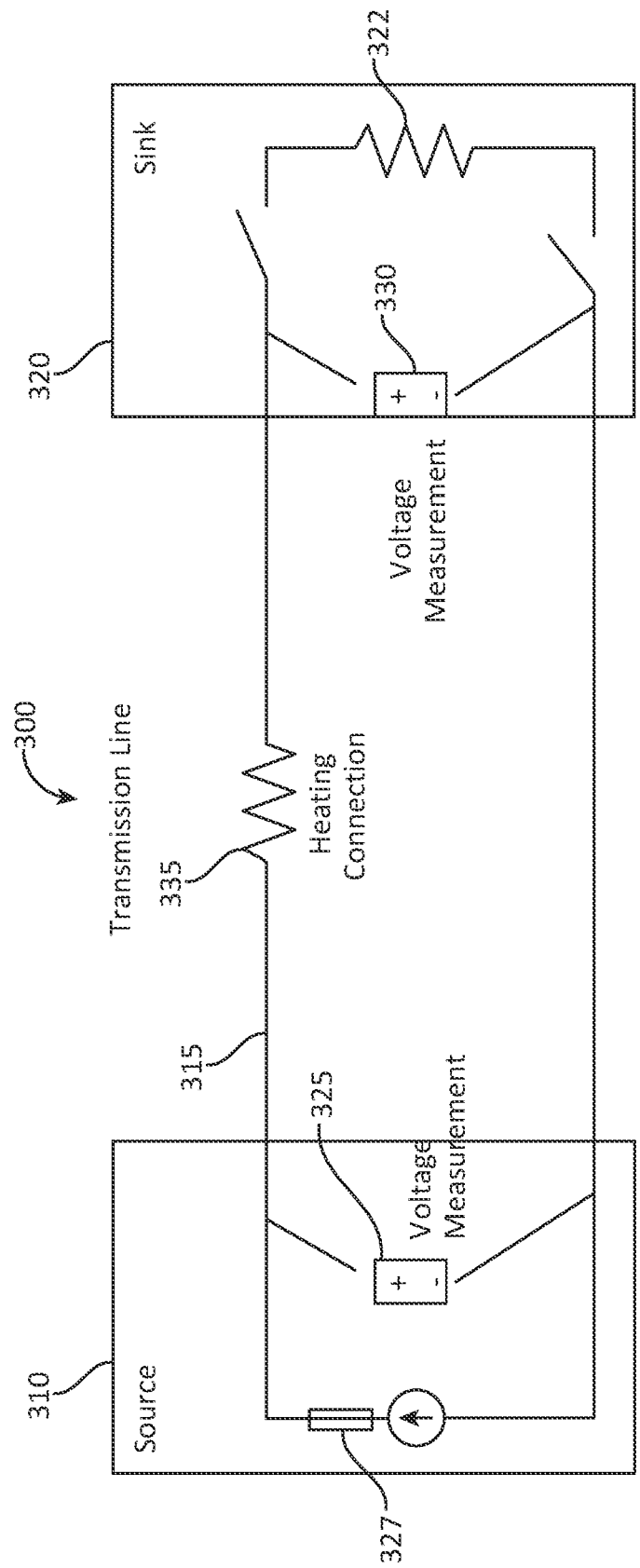
FIG. 3 is a diagram showing a kelvin sensing arrangement with respect to a current loop, according to an example embodiment.

FIG. 3 is a diagram that shows a kelvin sensing arrangement 300 with respect to a transmission line (current loop). The kelvin sensing arrangement 300 includes a source (power transmitter) 310 coupled via a transmission line 315 to a sink (power receiver) 320 that includes a load 322. There is a voltage measurement component 325 and a current measurement component 327 at the source 310, and a voltage measurement component 330 at the sink 320. The resistance in the transmission line 315 can be derived from the two measured voltages on the opposite ends. If there is a heating connection 335 in the transmission line 315, the resistance changes and such a heating connection 335 can therefore be detected.

In the techniques presented herein, periodic known current draws are used and thus the current source's voltage waveform can be any shape. This means that the current source can be Low Voltage Direct Current (DC), High Voltage DC, 50 Hz/60 Hz traditional Alternating Current (AC), higher frequency AC, or any other desirable waveform. It is to be understood that the load isolation point is at a time when there is a non-zero voltage on the line, but zero current. There is a dependency on the power factor and whether the current may be leading or lagging the voltage on the line. Nevertheless, as long as it can be determined that the remote load periodically draws near zero current for the safety interval, shock hazards are mitigated. Arc hazard mitigation is achievable with other waveforms. While DC draws are the easiest to facilitate the loop resistance measurement, proper coordination could allow this measurement on virtually any waveform as well.

Traditional 50 Hz/60 Hz AC waveforms are particularly attractive as they involve minimal conversion at the current source. They also allow easier reconstitution of the sine wave at the far end by simply smoothing over the safety interval gaps with appropriate analog filters. Such a system could easily replace branch circuit wiring provided the receptacle outlet involved performed the required periodic isolation operation. As explained above, in order to have sufficient voltage to sense faults, the power receiver can isolate the load at the zero-crossings of the AC waveform (for easier switching) but leave it off as the voltage rises, and confirm the current stays zero. If the current rises as voltage rises, then a fault may be declared.

Figure 4A:
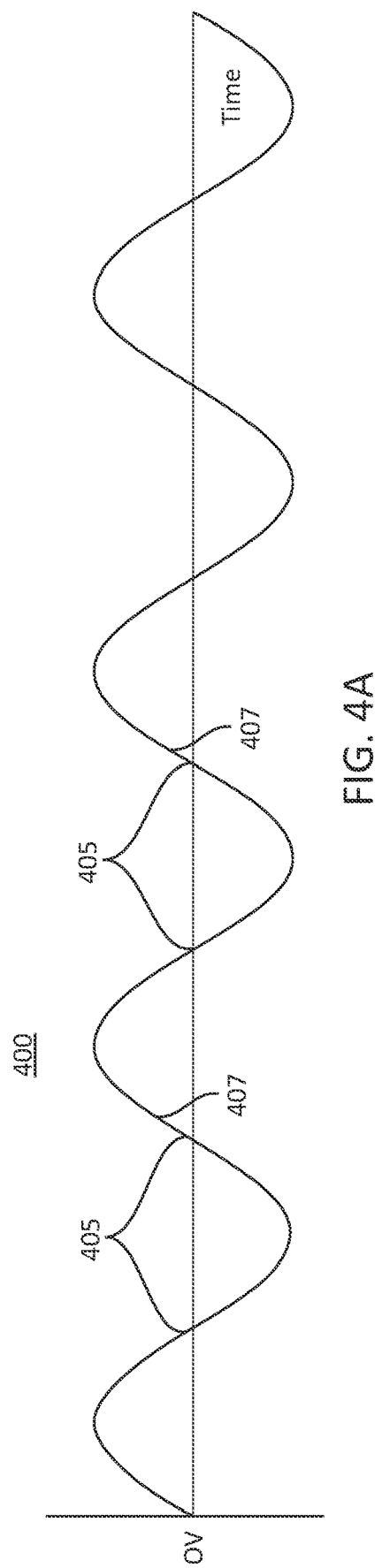
FIG. 4A illustrates an example AC power waveform that may be used in the fault managed power techniques presented herein, according to an example embodiment.

FIG. 4A illustrates an AC waveform 400 that is provided by a power transmitter to a power receiver over a transmission line. The AC waveform has zero crossings 405. The power receiver selects when to interrupt/disconnect from the transmission line (go to zero), synchronized with the AC waveform 400 so as to not reduce power transmission at the peaks. The disconnect/interrupt cycle of the power receiver would likely coincide to the rising portion of the AC waveform (assuming the AC waveform is rectified) after the zero crossings 405. In other words, the zero crossings 405 provides a good time for the power receiver to disconnect/switch the current off, but the power transmitter runs the safety check during the rising voltage waveform portion 407 that follows the zero crossings 405.

Figure 4B:
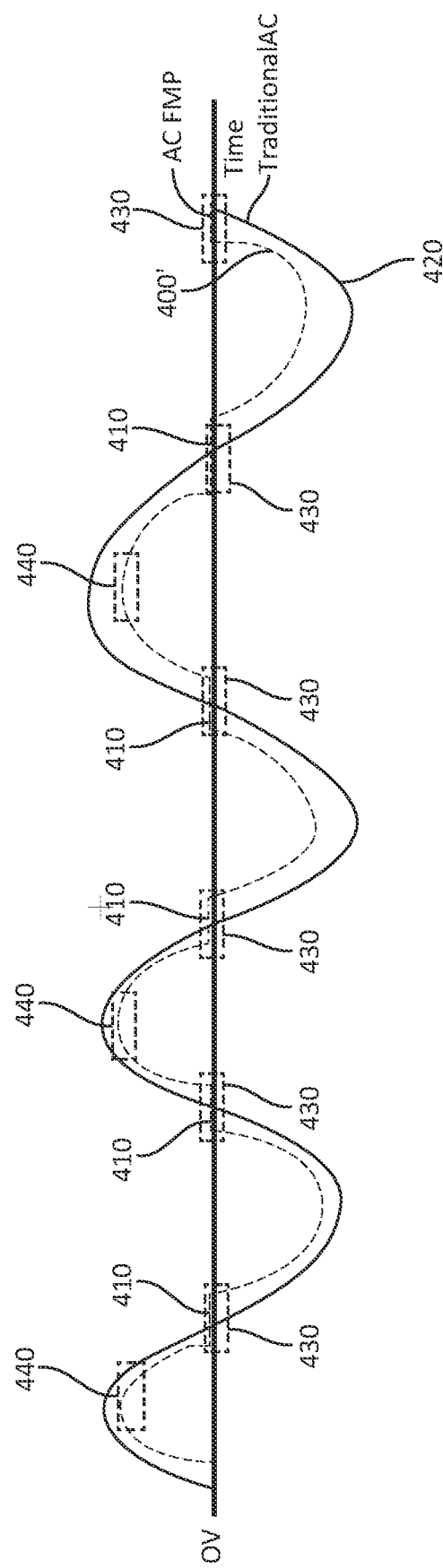
FIG. 4B shows an example of a modified AC power waveform with flattened zero crossings that may be used in the fault managed power techniques presented herein, according to an example embodiment.

FIG. 4B shows an example AC waveform 400' with flattened zero crossings 410, as compared to a traditional AC waveform 420 that does not have flattened zero crossings. The AC waveform 400' with the flattened or extended zero crossings 410 may be used to trigger the power receiver to disconnect/interrupt from the current loop to enable the power transmitter to perform the safety check as shown at 430 at a time when there is substantially zero current being applied to the current loop, and not necessarily at every occurrence of the flattened zero crossings 410. However, this is only an example. The flattened zero crossings may be generated by the power transmitter isolating (e.g., via switches) from the transmission line for a period of time just before and just after the zero crossings of an AC waveform, thereby extending the zero portion of the waveform. It may be useful for some applications to have an additional interruption to perform safety checks 440 at or near the peaks of the AC waveform 420, in addition to, or instead of, the safety checks 430 performed at the flattened zero crossings of the AC waveform 420. Thus, if more safety is desired, the interruptions for the safety check can be performed more often and not just when the AC waveform 400' is at the flattened zero crossings. This would affect the safety threshold to be used when performing the safety check at a time when the AC waveform 400' is not zero.

Figure 5:
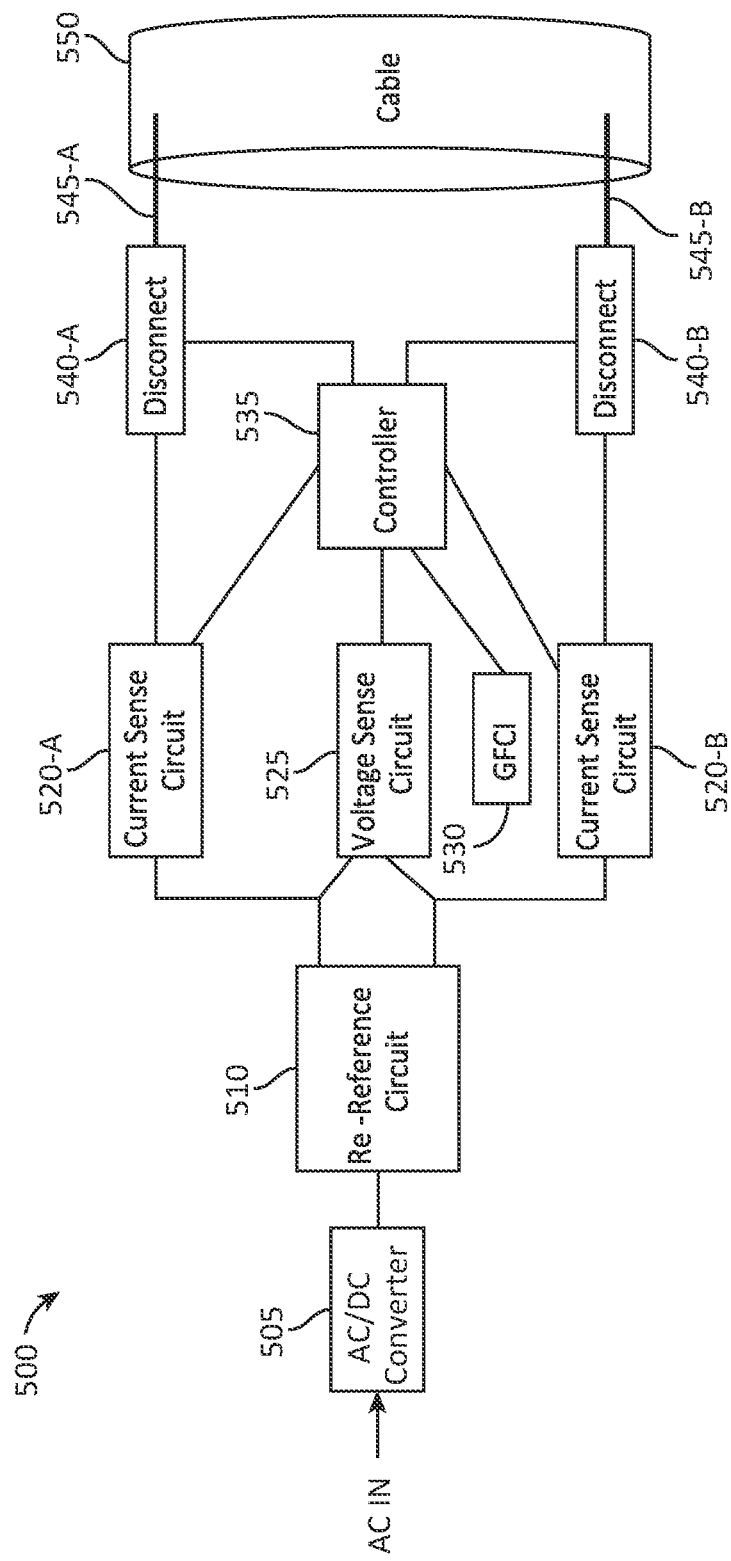
FIG. 5 is a block diagram of a DC power transmitter configured to perform the fault managed power techniques presented herein, according to an example embodiment.

Reference is now made to FIG. 5. FIG. 5 shows a block diagram of DC power transmitter 500 (i.e., Power Source Equipment (PSE)) configured to perform and participate in the fault managed power techniques presented herein. The DC power transmitter 500 includes an AC/DC converter 505, a re-reference circuit 510, two current sense circuits (current sensors) 520-A and 520-B, a voltage sense circuit (voltage sensor) 525, a ground fault circuit interrupter (GFCI) 530, a controller (CTRL) and two disconnects 540-A and 540-B. The GFCI 530 can operate any time (even when power is being delivered onto lines 545-A and 545-B) because it looks for mismatches as to what current is sent on one line and what current comes back on the other line.

The current sense circuits 520-A and 520-B are associated with respective lines of a current loop, and are coupled to the disconnects 540-A and 540-B, respectively, which are in turn connected to lines 545-A and 545-B that may be contained within a cable 550.

AC power is input from the left into the AC/DC converter 505, producing a DC voltage (e.g., 380V DC). The re-reference circuit 510 provides the DC voltage mid-point ground, producing two voltages at half of the DC voltage output by the AC/DC converter (e.g., +/−190V DC) onto two current paths. Each of these current paths traverses a current sensor, e.g., current sense circuit 520-A and 520-B, and their relative voltage is measured by the voltage sense circuit 525. The controller 535 receives the measurements from the current sense circuits 520-A and 520-B and the voltage sense circuit 525. The controller 535 may also be responsive to the GFCI 530 during power delivery time periods for added safety. The current sense circuits 520-A and 520-B measure current from the re-reference circuit 510 and passes these values to the controller 535. The current then flows to disconnect 540-A onto line 545-A into the cable 550 (to the power receiver) and comes back on the return current path on line 545-B into disconnect 540-B.

The controller 535 actuates at least one of the disconnects 540-A and 540-B to isolate power source current from the lines 545-A and 545-B (forming a current loop when connected at opposite ends to a power receiver) in the event safety criteria is not met according to the evaluation by the controller 535 of the line conditions (line-to-line fault detection according to the methodology described above in connection with FIGS. 2-4, a line-to-ground fault as detected by the GFCI 530, or other current or voltage conditions detected by the controller 535). The disconnects 540-A and 540-B may be relays or switches, such as field effect transistor (FET) switches, and in some embodiments, back-to-back FETs. The controller 535 may be a microprocessor, microcontroller or other digital logic device (with fixed or programmable digital logic gates) configured to perform the fault detection and alerting techniques described herein.

The controller 535 has its "hand on the button" of the disconnects 540-A and 540-B to shut at least one of them down (disconnecting from at least one of the lines 545-A and 545-B) if the power receiver (on the other end of the lines 545-A and 545-B) fails to do its safety check on the correct recurring basis, as described above. The controller 535 will also trigger at least one of disconnects 540-A and 540-B if a fault is detected (i.e. the power receiver did perform the safety check but the current did not fall below the prescribed value). The controller 535 is looking for the power on the line to shut off (because the power transmitter is expecting the power receiver to disconnect/interrupt on a recurring basis). As described above in connection with FIG. 2, the controller 535 is looking for this to happen at least once during the maximum safety check interval. The controller 535 monitors current on at least one of the lines 545-A and 545-B via the current sense circuits 520-A and 520-B, watching them simultaneously. There are two failure states: The current (after the power receiver disconnects/interrupts and stops pull current) settles above the safety threshold (FIG. 2); or the power receiver continues to draw current, never shutting down/interrupting prior to the expiration of the maximum safety check interval. From a logic perspective, these two states are essentially the same because all the power transmitter has to do is determine whether the current is below the safety threshold at least once before expiration of the maximum safety check interval. Once the controller 535 determines that safety has been met, it resets a counter/timer corresponding to the maximum safety check interval.

The controller 535 of the power transmitter 500 controls connectivity of power to the current loop depending on whether the safety check has or has not passed within the predetermined time interval. In one form, this controlling of the connectivity of the power to the current loop may involve disconnecting the power to the current loop when it is determined that the safety check has not passed within the predetermined time interval. This is how the operation is described above.

In another form, this controlling of the connectivity of the power to the current loop may involve maintaining connectivity of the power to the current loop if it is determined that the safety check has passed within the predetermined time interval. Thus, in this latter case, the controller 535 of the power transmitter 500 could be configured to generate a control to continue connection of power to the current loop (that would otherwise stop connection of the power if not periodically triggered to re-assert connection of power to the current loop (when the safety check is proven). In other words, the controller 535 generates a control to connect power to the current loop and that control is only re-asserted when the safety test has passed within the predetermined time interval.

Figure 6A:
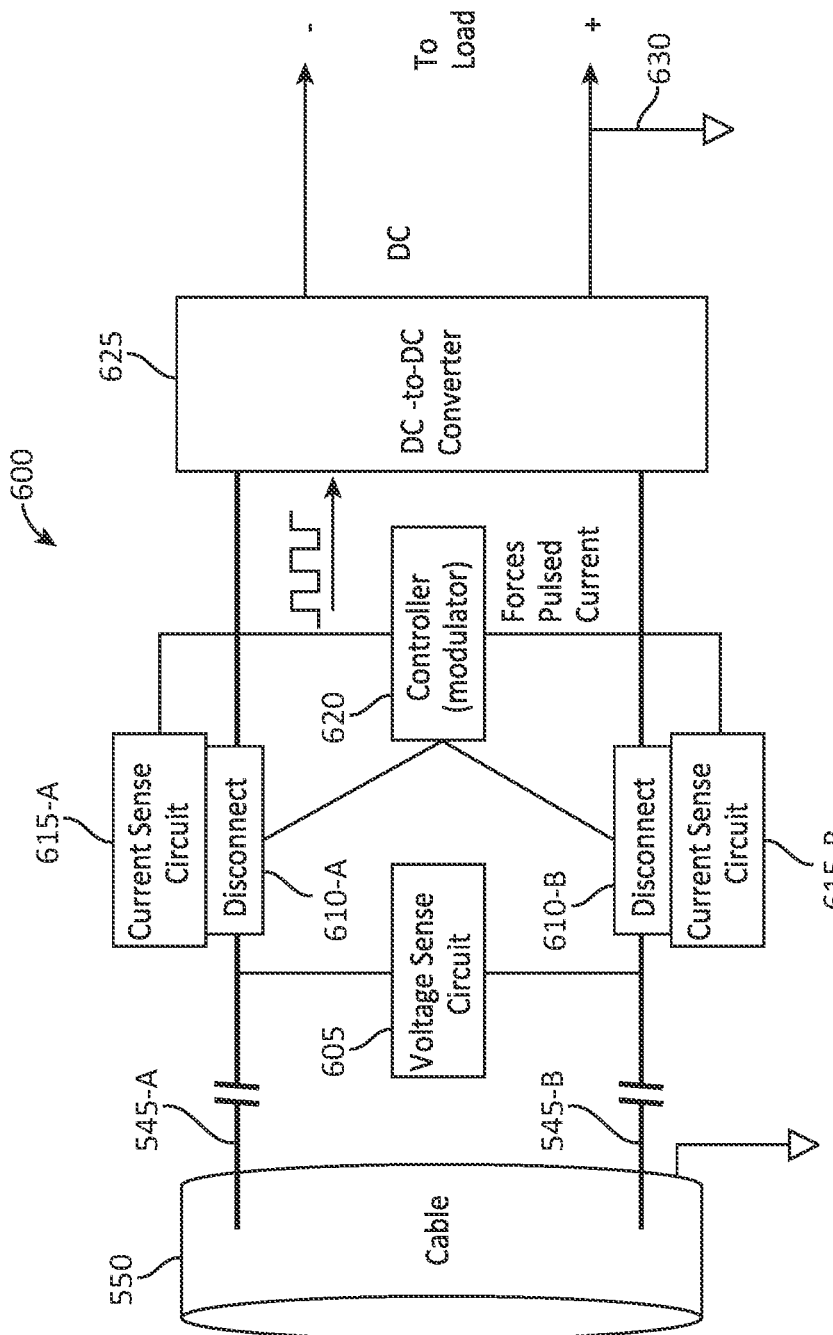
FIG. 6A is a block diagram of a DC power receiver configured to perform the fault managed power techniques presented herein, according to an example embodiment.

FIG. 6A is a block diagram of a DC power receiver (i.e., Powered Device (PD)) 600 that is coupled to cable 550 containing lines 545-A and 545-B (from FIG. 4, as an example). The DC power receiver 600 includes a voltage sense circuit 605, disconnects 610-A and 610-B that are connected to lines 545-A and 545-B, respectively, current sense circuits 615-A and 615-B connected to sense current on lines 545-A and 545-B, respectively, a controller (modulator) 620 and a DC-DC converter 625. As explained above, the lines 545-A and 545-B form a current loop between a power transmitter (not shown in FIG. 6A) and the power receiver 600.

The power receiver 600 receives the cable (lines 545-A and 545-B) as input, with an optional ground reference. The voltage sense circuit 605 makes a voltage measurement on the incoming power for telemetry, loop resistance calculation, or any other reason. This current path then traverses disconnects 610-A and 610-B as well as current sense circuits 615-A and 615-B on the respective line to enforce current limits. The controller 620 is configured to modulate at least one of the disconnects 610-A and 610-B by disconnecting the further power reception stages at the required interval to force a known current draw (likely near zero, but not necessarily). This demonstrates to the power transmitter that no faults are present on the lines 545-A and 545-B and the power receiver is up and running. This power is then fed to DC-to-DC converter 625 that renders DC power at a voltage, e.g., 380V DC, 48V DC, or a voltage according any other appropriate power delivery scheme. An optional load equipment ground conductor 630 is provided if grounding of the load is required/desirable. The disconnects 610-A and 610-B may be FETs, relays, etc. The controller 620 may be a microprocessor, microcontroller or other digital logic device (with fixed or programmable digital logic gates) configured to perform the fault detection and alerting techniques described herein.

A primary task of the controller 620 is to drive the at least one of disconnects 610-A and 610-B to disconnect from at least one of the lines 545-A and 545-B, respectively, to demonstrate safety at the required interval. The current sense circuits 615-A and 615-B may be employed to provide telemetry, and also to provide current measurement to the controller 620 if the load pulls too much current, serving as a backup plan if there is a short-circuit, etc. Again, the controller 620 and at least one of the disconnects 610-A and 610-B operate to interrupt the connection to a current loop (comprised of the lines 545-A and 545-B) on a recurring basis for the safety check interval 240 shown in FIG. 2, and then turn back on (e.g., after a minimum period has been observed).

Figure 6B:
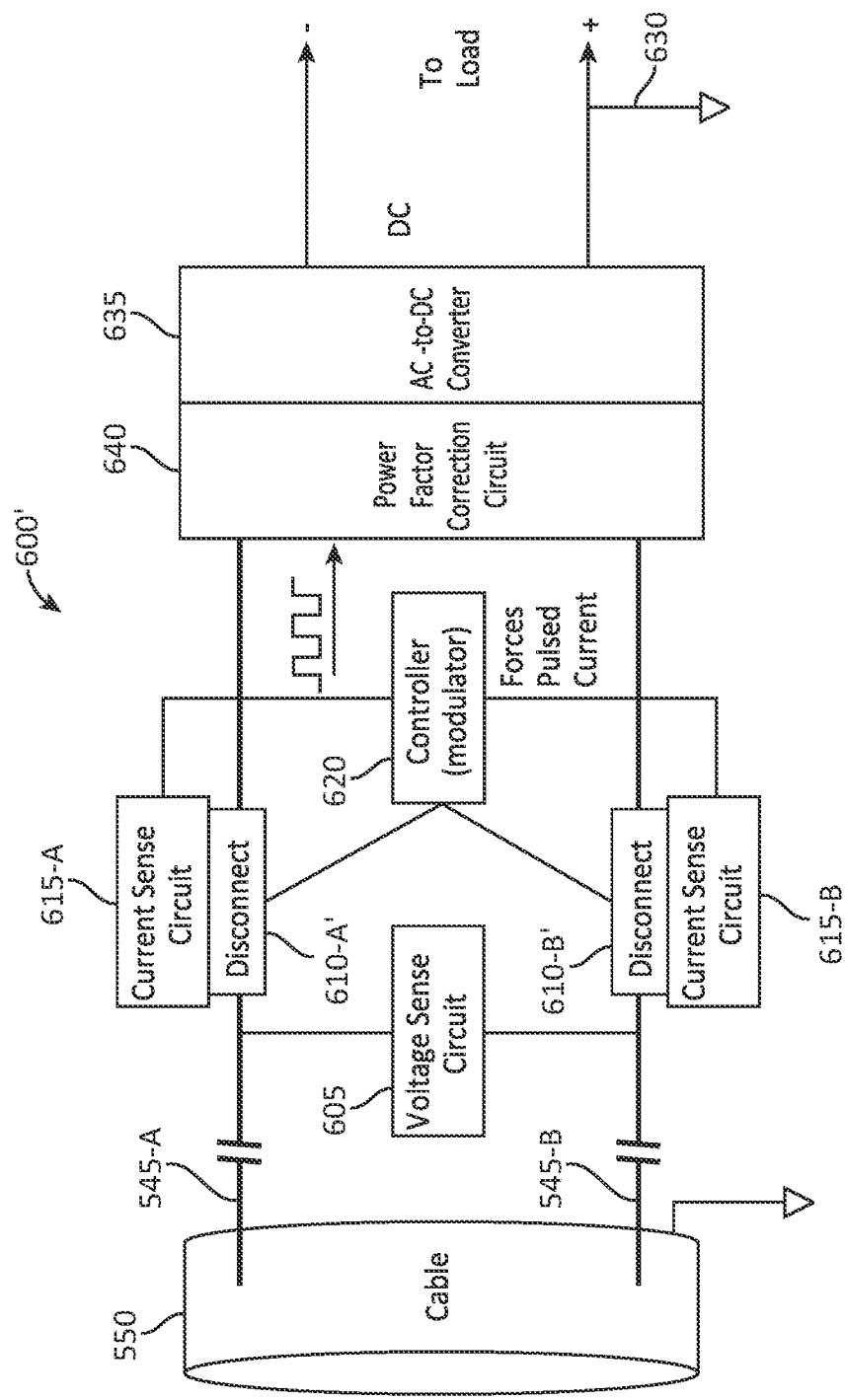
FIG. 6B is a block diagram of an AC power receiver configured to perform the fault managed power techniques presented herein, according to an example embodiment.

FIG. 6B illustrates a block diagram of an AC power receiver 600'. There are some components of the AC power receiver 600' that are the same as the DC power receiver 600 shown in FIG. 6A, as shown, with the exception of the disconnects 610-A' and 610-B', power factor correction circuit 640 and AC-to-DC converter 635. The disconnects 610-A' and 610-B' may take the form of triode for alternating current (TRIAC) devices or silicon controlled rectifier (SCR) devices that are able to handle AC currents. The power factor correction circuit 640 may be used to maintain power quality (reduce harmonics in the power waveform), and the AC-to-DC converter 635 converts the AC power to DC power that is provided to a load.

The controller 620 provides controls to at least one of the disconnects 610-A' and 610-B' to interrupt the AC power in order to allow for the safety check to be performed. In one form, as described above in connection with FIG. 4, the controller 620 initiates the interrupt around flattened zero crossings of the AC power waveform, shown at 430 in FIG. 4, subject to the condition that the load isolation point is at a time when there is a non-zero voltage on the line, as described above. If the interrupt is not performed around the flattened zero crossings, then the disconnects 610-A' and 610-B' take the form of SCRs to open at any time during the AC waveform in order to enable the power transmitter to make measurements on the lines 545-A and 545-B.

In the Underwriters Laboratory (UL) power safety standards, depending on the operating voltage, a device manufacturer may be required to interrupt power more often than the line frequency in order to meet the safety criteria. This is true for higher voltages, and it may be necessary to interrupt at the peak of the AC waveform (as shown at reference numeral 440 in FIG. 4), for example, to run a safety check. The AC power receiver 600' has that capability. Moreover, the AC power receiver 600' can interrupt power at both the flattened zero crossings as shown at reference numeral 430 and around the waveform peaks as shown at reference numeral 440, for certain safety applications. If the voltage of the waveform is lower, it may be possible to rely on running the safety checks only around the flattened zero crossings.

Figure 7:
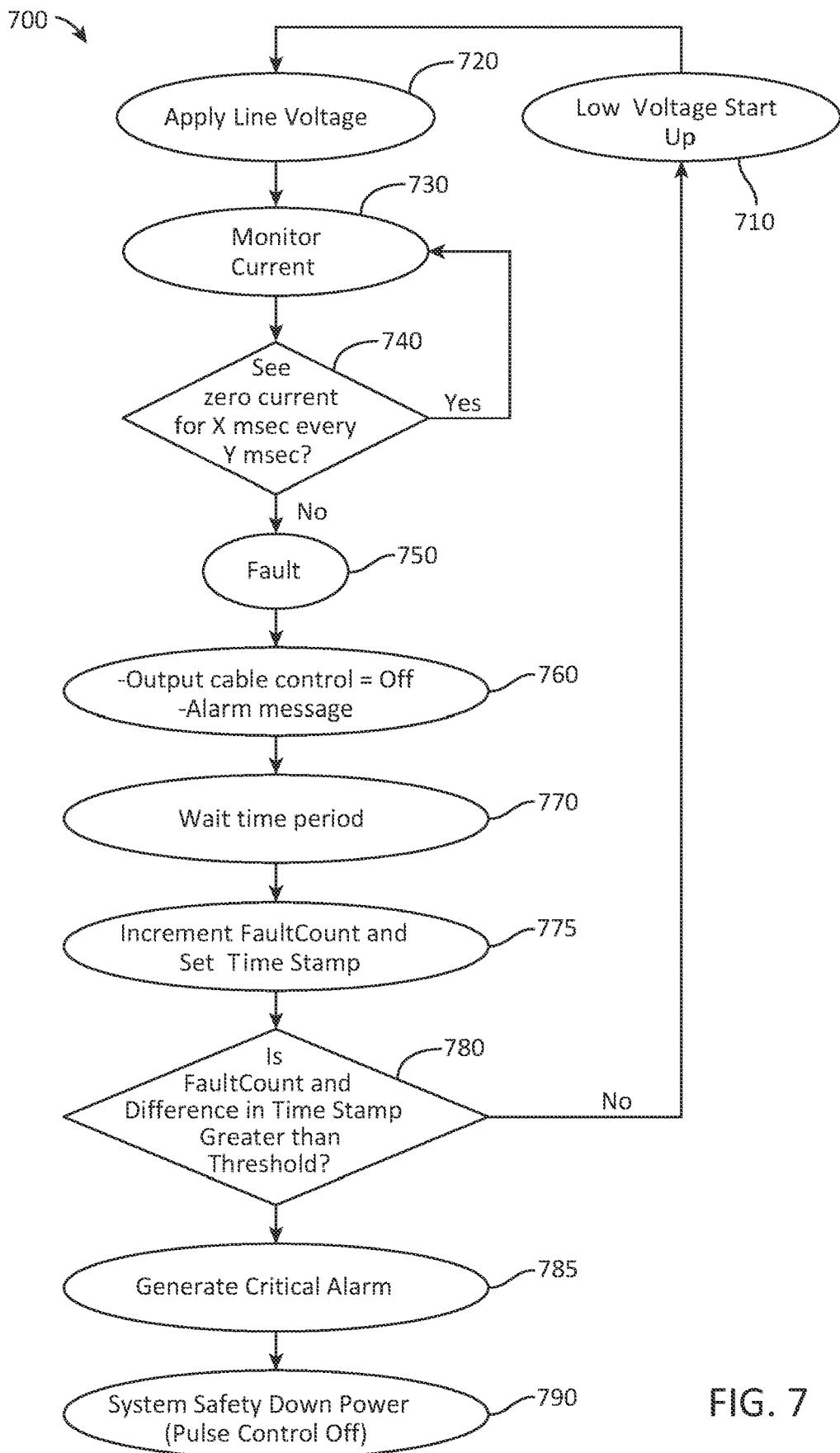
FIG. 7 is a state/flow diagram depicting operation of a power transmitter, according to an example embodiment.

Reference is now made to FIG. 7. FIG. 7 illustrates a state/flow diagram 700 depicting the operation of a power transmitter, according to an example embodiment. This state/flow diagram 700 is applicable to operation of any of the FMP transmitters presented herein. After low voltage start up at 710, the power transmitter applies a line voltage at 720 to the current loop of a cable to which a power receiver is connected. At 730, the power transmitter monitors current on the current loop, and in particular, at 740, it is looking for zero current for a period of time (X milliseconds (msec)) on a recurring basis (every Y mess), for example. If the power transmitter detects zero current for X mess every Y mess, then the operation returns/resets back to 730. If the power transmitter does not detect zero current every Y mess, then at 750 a fault is declared. Next, at 760, the power transmitter shuts off power to the cable, and an alarm message is generated by the controller of the power transmitter. At 770, a predetermined time period is allowed to elapse. Then, at 775, a fault counter (FaultCount) is incremented and a time stamp is set for the occurrence of the fault. At 780, the controller of the power transmitter determines whether the fault count and difference between time stamps of successive faults is greater than a threshold. If the threshold is not exceeded, then operation returns to low voltage start up at 710. If the threshold is exceeded, then the controller generates a critical alarm at 785. At 790, the controller initiates a system safety shut down of power and terminates pulse control of power to the current loop. This would allow for a further inspection of the current loop to determine the cause of the fault and remedy the situation.

To summarize, a method is presented herein, as depicted in FIG. 7, and other figures, that is performed at a power transmitter that provides power over a current loop to a power receiver. The method includes: coupling power to the current loop for transport to the power receiver; monitoring current level on the current loop; determining, by a controller of the power transmitter, whether the current level on the current loop passes a safety check within a predetermined time interval since a previous determination that the current level was not within a safe range; and controlling connectivity of the power to the current loop depending on whether the safety check has or has not passed within the predetermined time interval. As described above in connection with FIG. 2, the predetermined time interval may correspond to a maximum period of time that electrical current flowing into a fault that presents a shock or fire hazard.

The determining operation may involve determining, on a recurring basis, by a controller of the power transmitter, whether the current on the current loop exhibits a predetermined pattern (indicative of safety—no line faults—on the current loop). The controller will disconnect the power to the current loop when it is determined that the current does not exhibit the predetermined pattern.

The step of monitoring current on the current loop to determine whether current level passes the safety check may involve: determining whether the current level is less than a predetermined safety threshold corresponding to the safe range; and declaring the safety check passes when the current level is less than the predetermined safety threshold.

As described above in connection with FIGS. 2 and 7, monitoring current on the current loop to determine whether the current level passes the safety check within the predetermined time interval corresponds to an expected recurring performance of a power interruption operation performed by the power receiver, whereby the power interruption operation involves the power receiver not receiving power from the current loop for a period of time.

The step of controlling connectivity of the power to the current may comprise (either) one of: disconnecting the power coupled to the current loop when it is determined that the safety check has not passed within the predetermined time interval; or maintaining connectivity of the power to the current loop if it is determined that the safety check has passed within the predetermined time interval.

There may be other types of faults or conditions of a fault that the power transmitter may detect. For example, the power transmitter may monitor voltage on the current loop and the controller of the power transmitter may determine, based on the voltage on the current loop, that there is a fault in the current loop when the voltage is outside of an expected range. As another example, the power transmitter may monitor the current loop for a ground fault condition (e.g., using a GFCI included in the power transmitter) and the power transmitter may disconnect the power to the current loop when the ground fault condition is detected.

The power transmitter may be delivering DC power or AC power over the current loop to the power receiver.

Figure 8:
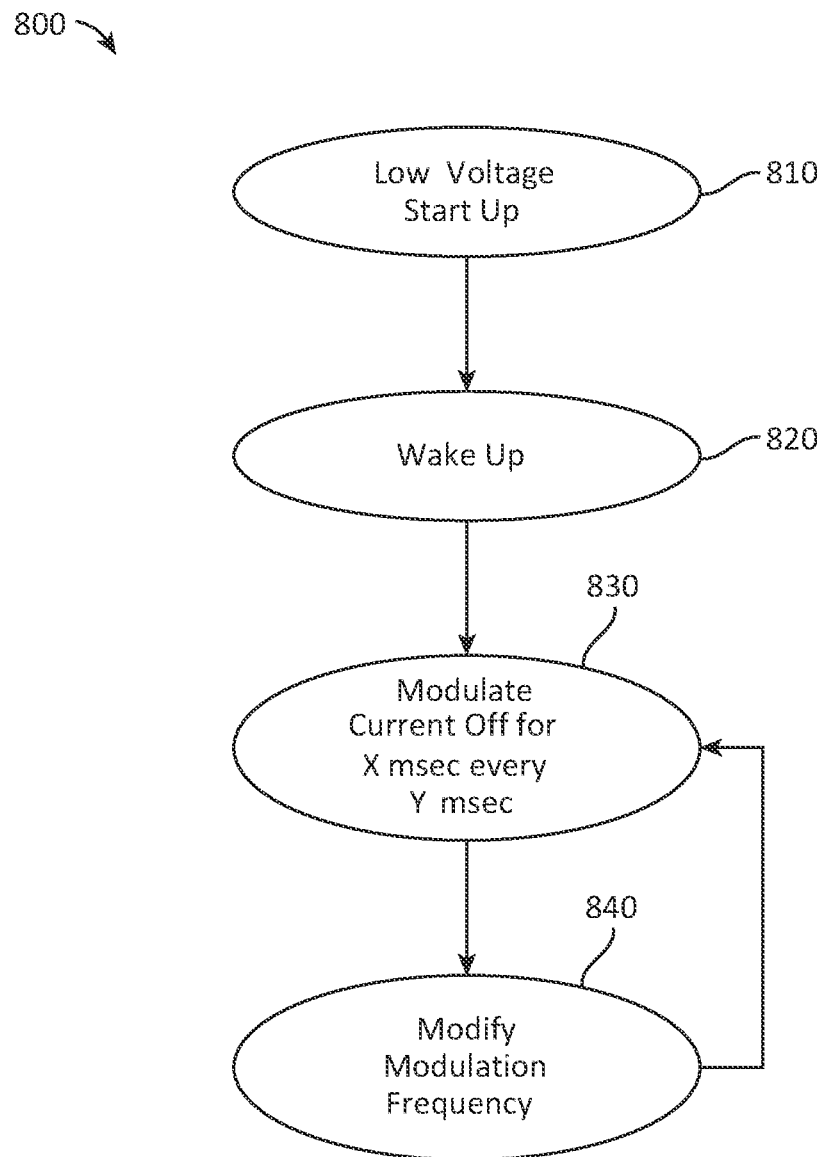
FIG. 8 is a state/flow diagram depicting operation of a power receiver, according to an example embodiment.

Turning now to FIG. 8, a state/flow diagram 800 is shown that depicts operation of a power receiver according to the embodiments presented herein. The power receiver wakes up at 820 after low voltage start up at 810. At 830, the controller of the power receiver modulates current (i.e., disconnects from the current loop) to zero (off) for X msec every Y msec. This allows the power transmitter to measure for zero current on the current loop on a recurring basis, as described above. However, the power receiver is not synchronized in any way to the power transmitter in this regard. At 840, the controller of the power receiver may modify or adjust the modulation frequency (frequency of occurrence of interruption from power) that is performed at operation 830 to spread a frequency of energy associated with current pulses which result from the interruptions caused by the disconnecting from the power. The modulation frequency operation 840 may happen once at power receiver startup or may happen dynamically during operation to spread energy associated with the interrupted current pulses across multiple frequencies. This modulation of the frequency of the disconnection changes the frequency of the interrupted current pulses that may ride on top of an AC waveform. For DC, the line voltage has no inherent frequency, but the repeated interruption creates a frequency, and the frequency modulation technique can be used as well for DC systems to improve compliance.

Figure 9A:
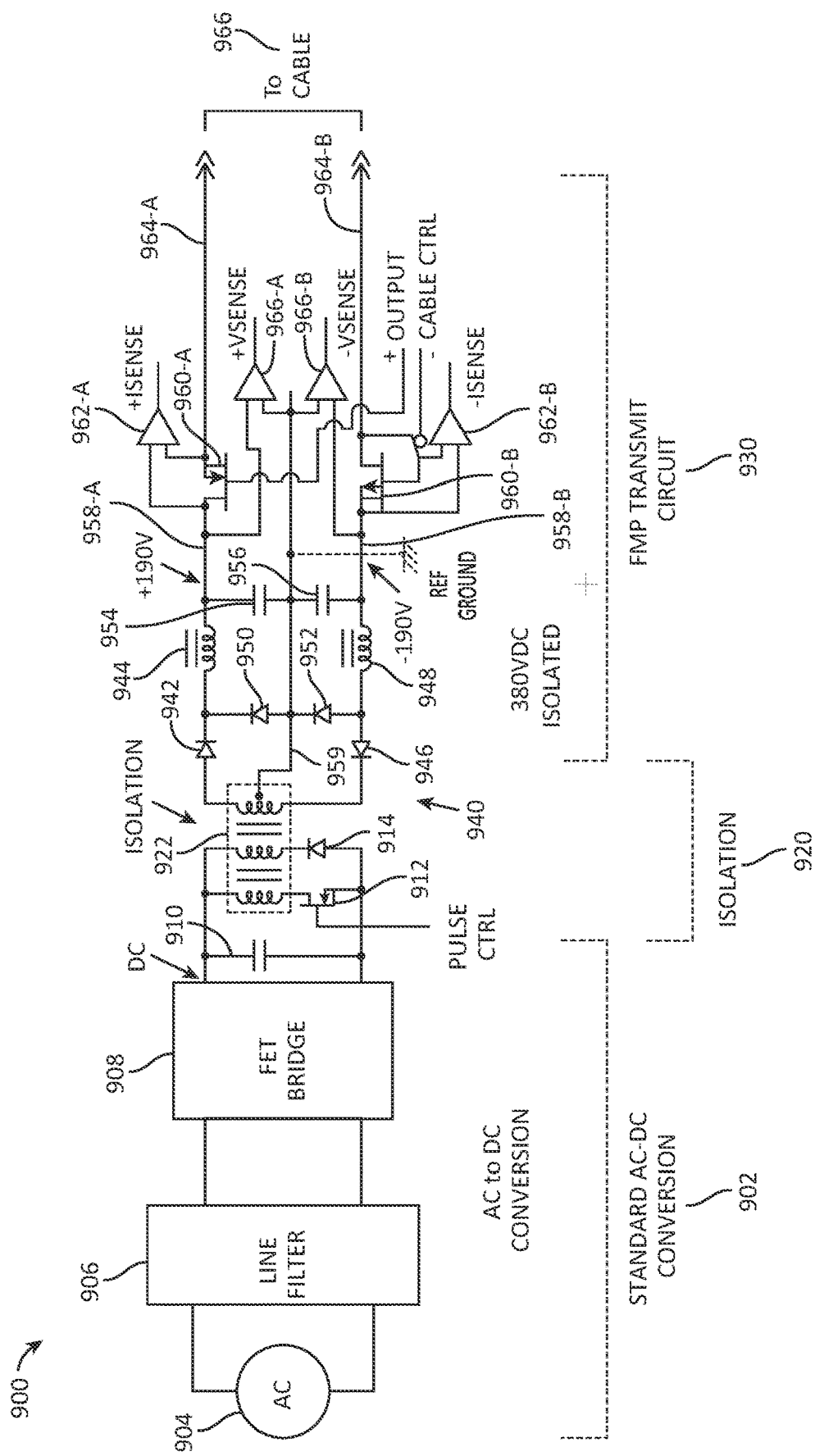
FIG. 9A is a schematic diagram of a fault managed power transmitter, according to an example embodiment.
Figure 9B:
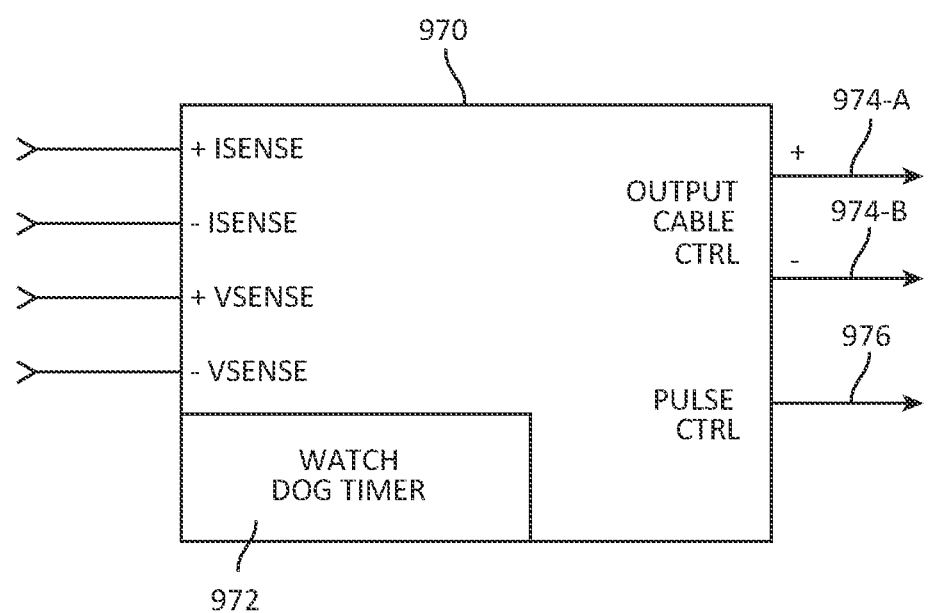
FIG. 9B is a diagram of a controller used in the fault managed power transmitter depicted in FIG. 9A, according to an example embodiment.

FIGS. 9A and 9B illustrates a schematic diagram of an AC-DC FMP transmitter 900 according to an example embodiment. FIG. 9A shows a more detailed diagram of AC-DC FMP transmitter 900 that includes an AC-to-DC conversion section 902 having an AC power supply 904, a line filter 906, a FET bridge 908 and a capacitor 910. A FET 912 is provided to generate pulse power such that the DC output can traverse the isolation transformer. The FET 912 is responsive to a pulse control (CTRL) signal from the controller, as described further below. The FET 912 and diode 914 are connected to an isolation section 920. The isolation section 920 includes three coupled inductors forming a transformer, shown collectively at 922.

An FMP transmit circuit 930 is coupled to the isolation section 920. The FMP transmit circuit 930 includes a reference circuit 940 that includes a center tapped output of the transformer of the isolation section 922, diode 942, diode 946, diode 950 and diode 952. The four diodes 942, 946, 950 and 952 protect against reverse current and clamp any current ringing.

The inductors 944 and 948, together with capacitors 954 and 956, respectively, create filters for voltage smoothing. The node between diodes 950 and 952 are coupled to a reference ground 959. The reference circuit 940 divides (by 2) the voltage at its input. For example, if 380 VDC is at the input of the rectifier and reference circuit 940, then the output on line 958-A is +190V and the output on line 958-B is −190V. The isolated ground achieved by the isolation section 920 allows the reference ground (shown at reference numeral 959 in FIG. 9A) of the FMP transmit circuit 930 to track earth ground or an isolated ground.

A disconnect FET 960-A is connected to line 958-A and a disconnect FET 960-B is connected to line 958-B. FETs 960-A and 960-B are responsive to/controlled by Output Cable CTRL signals (+ and −). A first current sense amplifier 962-A is connected across FET 960-A to measure the current flowing on line 958-A through the FET 960-A to send path line 964-A. The output of the first current sense amplifier 962-A is referred to as +ISENSE. Similarly, a second current sense amplifier 962-B is connected across FET 960-B to measure the current flowing on line 958-B through the FET 960-B to return current path line 964-B. The output of the second current sense amplifier 962-B is referred to as −ISENSE. In addition, a first voltage sense amplifier 966-A is connected to line 958-A and the reference ground, and a second voltage sense amplifier 966-B is connected to line 958-B and the reference ground. The output of the first voltage sense amplifier 966-A is referred to as +VSENSE and the output of the second voltage sense amplifier 966-B is referred to as −VSENSE. The send path line 964-A and return path line 964-B may be contained within cable 966.

Reference is now made to FIG. 9B, which shows a controller 970 that controls operations of the AC-DC FMP transmitter 900. The controller 970 receives as input the output signals of the current sense circuits and voltage sense circuits shown in FIG. 9B, that is, +ISENSE, −ISENSE, +VSENSE, −VSENSE. The controller 970 executes a watch dog timer 972 corresponding to the maximum safety check interval, and generates as Output Cable CTRL signals (+ and −) shown at 974-A and 974-B which are coupled to the disconnect FETs 960-A and 960-B, respectively, shown in FIG. 9A. The controller 970 also generates the Pulse CTRL signal 976 that is coupled to the FET 912 shown in FIG. 9A.

This controller 970 is configured to perform the operations described above in connection with the previous figures, based on the input signals +ISENSE and −ISENSE (as well as +VSENSE and −VSENSE), in order to ensure that the power receiver interrupts/disconnects, as it is supposed to, to enable a safety check during which the power transmitter observes the current behavior on the lines that it needs to see to confirm safety. If the power transmitter 900 cannot verify safety, then it generates Output Cable CTRL signals 974-A and 974-B that are coupled to the disconnect FETs 960-A and 960-B to disconnect the power to the lines 964-A and 964-B, respectively. (It should be understood that it only one of the disconnect FETs 960-A and 960-B needed be triggered to disconnect, breaking the current loop and thus preventing current flow.)

The pulse CTRL signal 976 is coupled to FET 912 at the primary of the transformer in the isolation section 922 to perform switch-mode power supply operations. The FET 912 is controlled to turn on and off by the pulse CTRL signal, causing the creation and collapsing of the magnetic field in the transformer of the isolation section 920, which gets induced on the tap on the other side of the isolation section 920, for energizing the power transmitter circuit 930. The controller 970 of the FMP transmitter circuit 930 may shut off the pulse control operation by shutting down (on/off states) of the pulse CTRL signal to the FET 912 when the power transmitter 930 does not see the power receiver, on the other end of the cable, behaving appropriate, according to the techniques described above in connection with FIGS. 2-8. Thus, the controller 970 may shut down power to the cable when safety is not proven by (1) triggering one or more of the disconnect FETs 960-A and 960-B to disconnect from their associated line; (2) shutting off the pulse CTRL signal to the FET 912 on the isolation section, thereby shutting down power well upstream of the disconnect FETs 960-A and 960-B; or (3) performing both (1) and (2).

Figure 10:
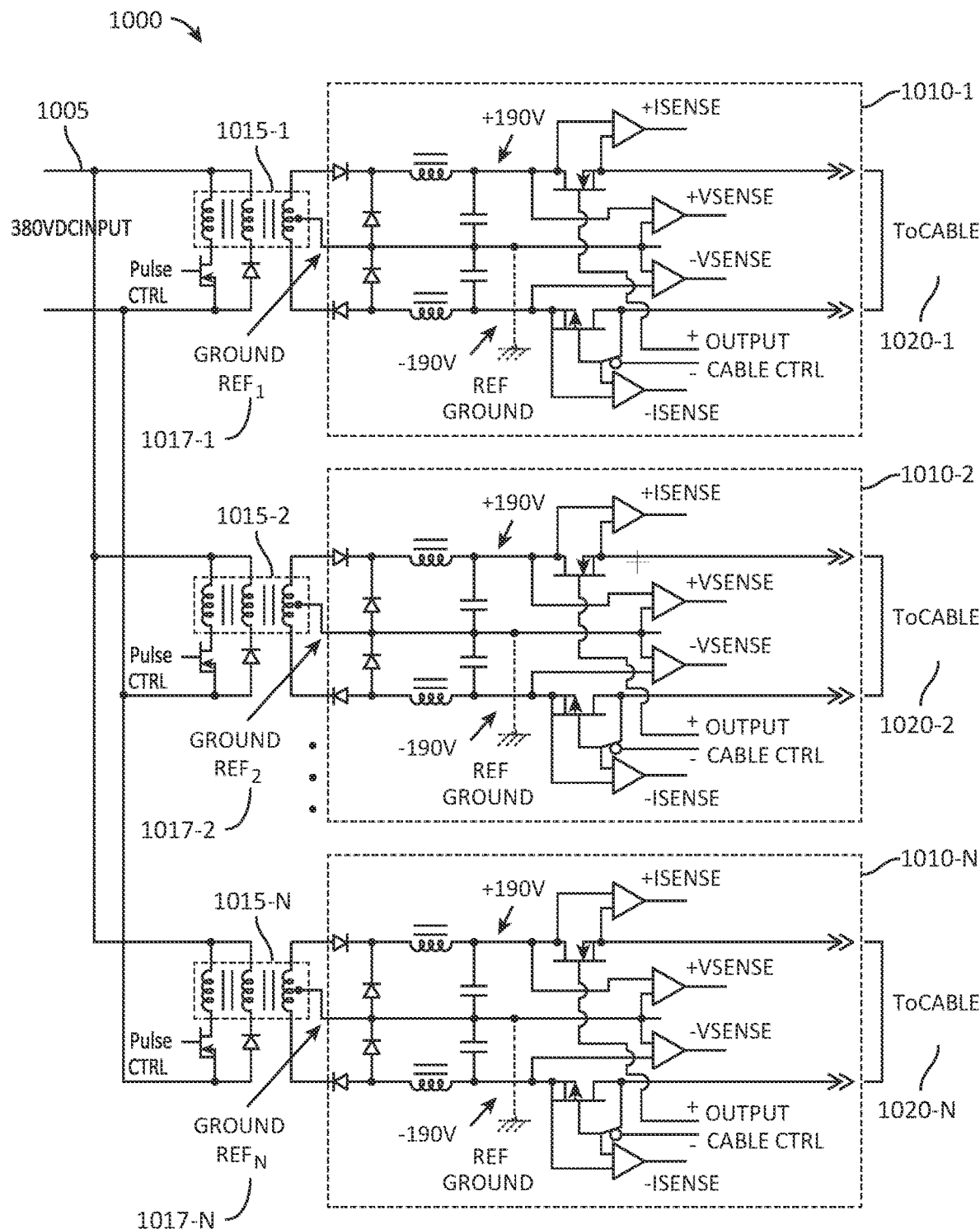
FIG. 10 is a schematic diagram of a system that includes a plurality of fault managed power transmitters each providing power to a corresponding cable, according to an example embodiment.

The isolation section 920 provides additional isolation to enable multiple isolated FMP transmitters off the same base DC voltage, and they would all be isolated from each other. To this end, reference is now made to FIG. 10. FIG. 10 shows a system 1000 that is an extension of FIG. 9A and which comprises a plurality of FMP transmit circuits driven by a single DC voltage input (which may be derived from AC power, as depicted in FIG. 9A). More specifically, the system 1000 includes a DC power input (e.g., 380 V DC) 1005 that is coupled to a plurality of FMP transmitter circuits 1010-1 to 1010-N via an associated isolation section 1015-1 to 1015-N. The circuit element details of each FMP transmitter circuit 1010-1 to 1010-N and each of the isolation sections 1015-1 to 1015-N may be the same as that described above in connection with FIG. 9A. It is to be understood that each FMP transmitter circuit 1010-1 to 1010-N includes an associated/dedicated controller, similar to that shown in FIG. 9B, but for simplicity, the respective controllers are not shown in FIG. 10.

The FMP transmitter circuits 1010-1 to 1010-N are thereby isolated from each other. Each FMP transmitter circuit 1010-1 to 1010-N may be connected to an associated cable to provide power to a power receiver at the other end of the associated cable. That is, FMP transmitter circuit 1010-1 provides power to cable 1020-1, FMP transmitter 1010-2 provides power to cable 1020-2 and FMP transmitter 1010-N provides power to cable 1020-N.

Each isolation section 1015-1 to 1015-N provides a respective ground reference for its associated FMP transmitter circuit 1010-1 to 1010-N. That is, isolation section 1015-1 provides a ground reference (Ground $Ref_1$) shown at reference numeral 1017-1 for FMP transmitter circuit 1010-1, isolation section 1015-2 provides a ground reference (Ground $Ref_2$) shown at reference numeral 1017-2 for FMP transmitter circuit 1010-1, and isolation section 1015-N provides a ground reference (Ground $Ref_N$) shown at reference numeral 1017-N for FMP transmitter circuit 1010-N. The architecture of the system 1000 allows for Ground $Ref_1$—Ground $Ref_N$ to be tied to earth ground independently.

It should be understood that the isolation sections 1015-1 to 1015-N could be all one multi-winding transformer. In such a case, there may be one pulse control signal and one snubber winding (the winding with the associated diode) and many center-tapped output windings.

Figure 11:
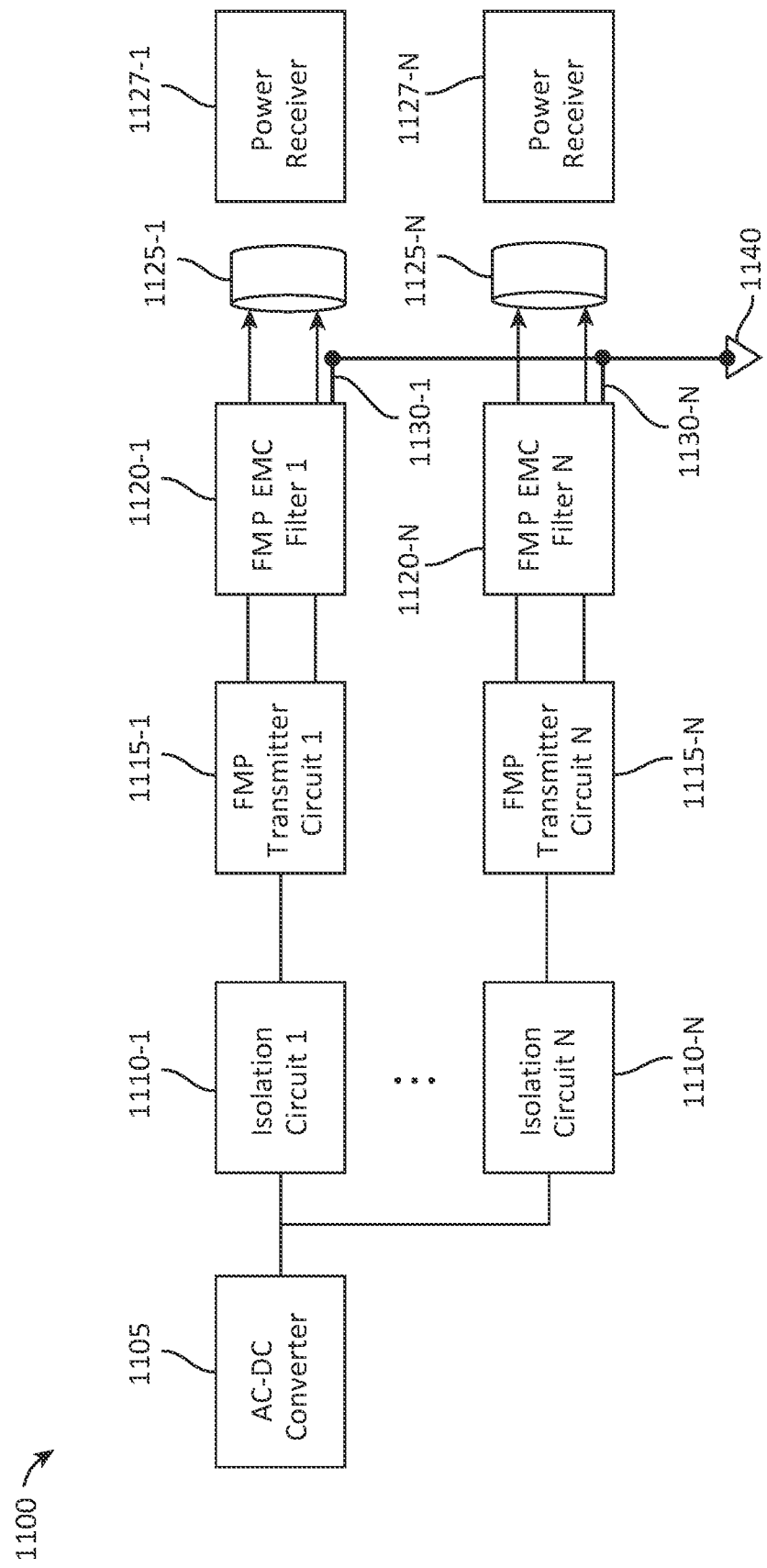
FIG. 11 is a block diagram a system including a plurality of fault managed power transmitters and a plurality of electromagnetic interference/electromagnetic compatibility (EMI/EMC) filters each to connect the output from an associated fault managed power transmitter to a corresponding cable, according to an example embodiment.

Reference is now made to FIG. 11, which is an even further extension of the system 1000 of FIG. 10. Isolating each of the FMP transmitter circuits from each other allows Ground $Ref_1$ to have an electromagnetic interference/electromagnetic compatibility (EMI/EMC) filter that is different from Ground $Ref_N$, which would otherwise be necessary when FMP transmitter circuit 1 has a different power output than FMP transmitter circuit N. FIG. 11 shows a system 1100 that includes an AC-to-DC conversion circuit 1105, a plurality of isolation circuits 1110-1 to 1110-N, a plurality FMP transmitter circuits 1115-1 to 1115-N, and a plurality of FMP EMC filters 1120-1 to 1120-N, which are in turn coupled to cables 1125-1 to 1125-N. There are power receivers 1127-1 to 1127-N connected to opposite ends of cables 1125-1 to 1125-N. Each of the FMP EMC filter 1120-1 to 1120-N further includes a connection 1130-1 to 1130-N to earth ground 1140. Again, the isolation circuits 1110-1 to 1110-N allow for each FMP transmitter 1115-1 to 1115-N to have a different EMC filter.

Figure 12:
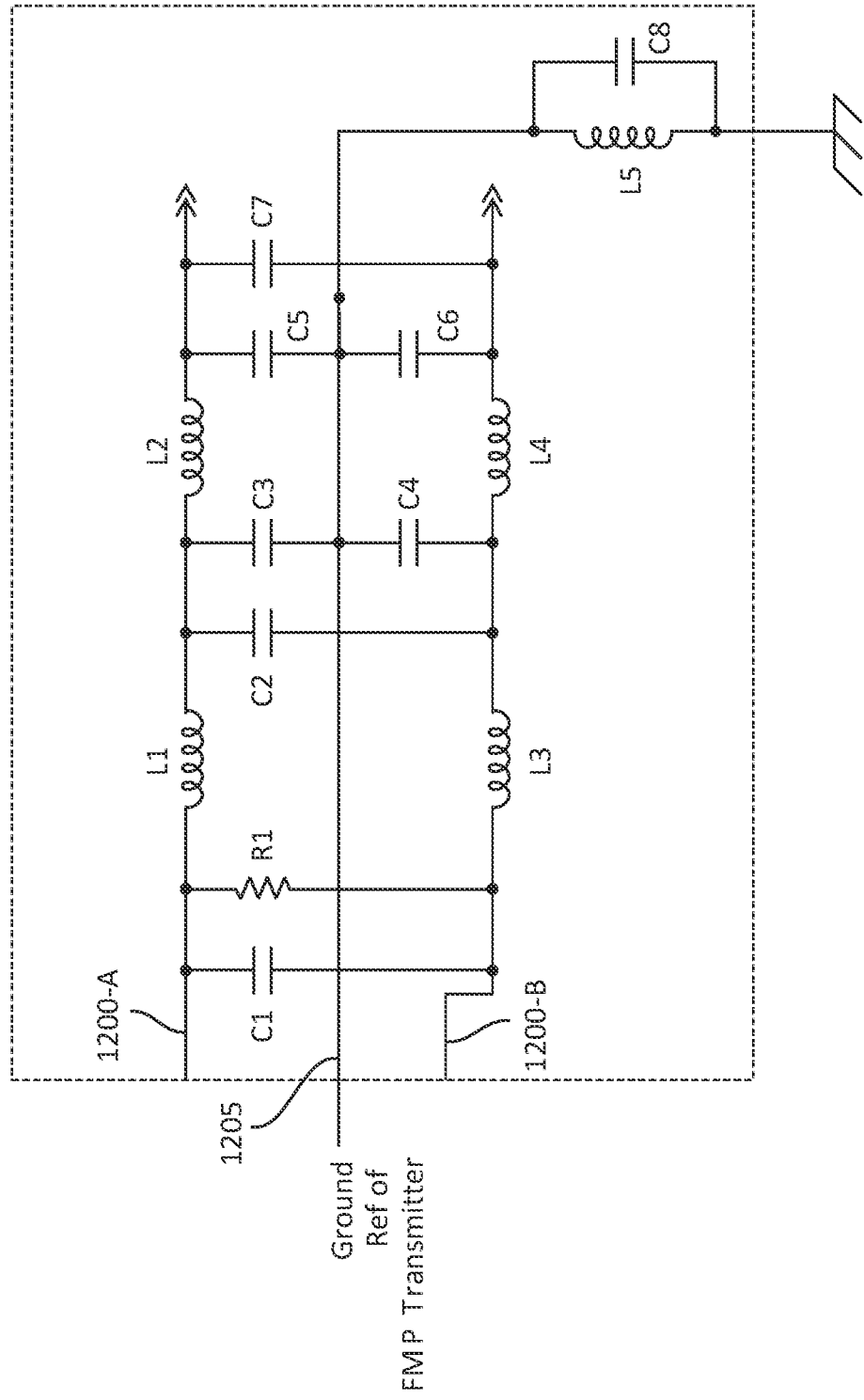
FIG. 12 is a schematic diagram of an EMI/EMC filter that may be used in the system of FIG. 11, according to an example embodiment.

FIG. 12 shows a schematic diagram of the FMP EMC filters 1120-1 to 1120-N, according to an example embodiment. Each FMP EMC filter connects to the output lines 1200-A and 1200-B from an associated FMP transmitter circuit, as well as to line 1205 which is connected to the ground reference for the associated FMP transmitter circuit. The FMP EMC filter includes an arrangement of R-C and L-C filter circuits, and is only one example of a possible configuration.

Each FMP EMC filter includes a capacitor C1 and a resister R1 connected across the lines 1200-A and 1200-B. Inductor L1 is connected to line 1200-A at one end of resistor R1 and inductor L3 is connected to line 1200-B at the other end of resistor R1. Capacitor C2 is connected across lines 1200-A and 1200-B, whereas capacitor C3 is connected between one end of inductor L1 and the line 1205 (ground reference), and capacitor C4 is connected between the line 1205 (ground reference) and one end of inductor L3. Inductor L2 is connected to inductor L1 and inductor L4 is connected to inductor L3. On the other side of inductors L2 and L4 are capacitors C5 and C6. Capacitor C5 is connected between one end of inductor L2 and line 1205, and capacitor C6 is connected to the line 1205 and one end of inductor L4. Capacitor C6 is connected across inductors L2 and L4. The outputs of the FMP EMC filter is taken at the ends of capacitor C7. There is a further L-C filter consisting of inductor L5 connected in parallel with capacitor C8, and connected between line 1205 and earth ground. The L-C filter of inductor L5 and C8 allow for noise filtering between FMP transmitter circuits 1115-1 and 1115-N.

PSE System Initialization

Initialization of the system is greatly simplified over previous implementations by this new method. No synchronization is required. All that is required is for a sufficient amount of power to be applied to the remote receiver to allow its control circuits to turn on and become active.

In the case where the remote system can become active in less than one safety interval, the system can begin operation at the highest voltage possible. The end device would have to energize and initialize, and isolate itself within the minimum safety interval; otherwise it would be disconnected. Where receiver start up takes longer than one safety interval, the current for startup would have to stay below the prescribed safety level or the receiver would have to store charge in between each fault cycle.

While this immediate powering method is attractive for its simplicity, it can be improved by adding a low voltage initialization phase, which includes probing and possibly communication prior to engaging high voltage.

PD Enrollment (PDE)—Low Voltage Phase

A low voltage (e.g., less than 12.4 volts to ground for DC interrupted at a rate of 10 to 200 Hz) is placed on the conductors for a duration sufficient to energize a remote device. If no current is drawn, then no device is present. If a fault current is drawn, then then circuit is in a fault state and shut down.

If a current is drawn that is within bounds, then coordination/communication can commence.
 a. Communication could be via a simple PoE style classification pulse system.
 b. Communication could be via a Power Line Communications (PLC)-style bandpass communication scheme.

c. Communication could be via a Serial Communication Classification Protocol (SCCP)-style (from IEEE 802.3) baseband communication scheme.

Once the remote device is verified to be valid, then the remote device should begin the periodic isolation procedure. Once the current source validates adherence to the safety protocol, the next period of initialization may commence.

PD Enrollment—High Voltage DC (HVDC) Phase

Once LV safety interval compliance is demonstrated, the current source can increase the source voltage to its nominal operation state. It will remain at this voltage until a safety event forces a shutdown.

Ongoing Transmission Line HV Safety Check

If at any time the remote load does not isolate itself from the line for the required settling interval for longer than the safety interval, the load will be shut down. If at any time the current during the safety interval is not close enough to zero for a sufficient period of time, the load will be shut down. The expected current settling interval should be estimated by the system and factored into the timing profile without exceeding the relevant safety requirements. This may mean that current draw at the receiver should stop sooner on longer cables and the inductance of the cable will require a longer settling time before a valid comparison to the near-zero threshold can be made.

HVDC Current Monitoring

If at any time the current on both conductors is not equal at the current source, or if it exceeds the rated current of the circuit, the load will be shut down. If at any time the current goes to zero and remains zero for a sufficient period to indicate the load was disconnected, then the current source will disconnect high voltage and return to a detection probing state.

Emergency Shutdown Procedure

Should a fault be identified, the current source will open its circuit breaking element to cut off the supply of current, and engage the rapid line drain resistors ("crowbar") to render the transmission line safe as quickly as possible.

Power Transmitter Side Aspects

In some aspects, the techniques described herein relate to a method performed at a power transmitter that provides power over a current loop to a power receiver, the method including: coupling power to the current loop for transport to the power receiver; monitoring current level on the current loop; determining, by a controller of the power transmitter, whether the current level on the current loop passes a safety check within a predetermined time interval since a previous determination that the current level was not within a safe range; and controlling connectivity of the power to the current loop depending on whether the safety check has or has not passed within the predetermined time interval.

In some aspects, monitoring current on the current loop to determine whether the current level passes the safety check includes: determining whether the current level is less than a predetermined safety threshold corresponding to the safe range; and declaring the safety check passes when the current level is less than the predetermined safety threshold.

In some aspects, the predetermined time interval corresponds to a maximum period of time that electrical current flowing into a fault that presents a shock or fire hazard.

In some aspects, monitoring current on the current loop to determine whether the current level passes the safety check within the predetermined time interval corresponds to an expected recurring performance of a power interruption operation performed by the power receiver, whereby the power receiver stops receiving power from the current loop for a period of time.

In some aspects, controlling connectivity of the power to the current loop includes one of: disconnecting the power coupled to the current loop when it is determined that the safety check has not passed within the predetermined time interval; or maintaining connectivity of the power to the current loop if it is determined that the safety check has passed within the predetermined time interval.

In some aspects, the method further includes: monitoring voltage on the current loop; and determining, by the controller, based on the voltage on the current loop, that there is a fault in the current loop when the voltage on the current loop is outside of an expected range.

In some aspects, monitoring further includes monitoring the current loop for a ground fault condition; and the method further includes: disconnecting the power to the current loop when the ground fault condition is detected.

In some aspects, the power is direct current (DC) power.

In some aspects, the power is alternating current (AC) power.

In some aspects, the techniques described herein relate to an apparatus including: a power source configured to provide power to a current loop for transport to a power receiver; at least one current sensor coupled to a current loop to sense current on the current loop; and a controller coupled to the at least one current sensor, wherein the controller is configured to: determine whether a current level on the current loop passes a safety check within a predetermined time interval since a determination that the current level was not within a safe range; and generate a control for connectivity of the power to the current loop depending on whether the safety check has or has not passed within the predetermined time interval.

In some aspects, the controller is configured to generate the control for connectivity of the power to the current loop by one of: generating a control to disconnect the power coupled to the current loop when it is determined that the safety check has not passed within the predetermined time interval; or generating a control to maintain connectivity of the power to the current loop if it is determined that the safety check has passed within the predetermined time interval.

In some aspects, the controller is configured to determine whether the current level passes the safety check by: determining whether the current level is less than a predetermined safety threshold corresponding to the safe range; and declaring the safety check passes when the current level is less than the predetermined safety threshold.

In some aspects, the apparatus further includes: a switch, field effect transistor or relay coupled to the current loop and responsive to the control from the controller to connect or disconnect the power from the power source to the current loop.

In some aspects, the apparatus further includes a voltage sensor configured to sense voltage on the current loop, and wherein the controller is configured to determine, based on the voltage sensed on the current loop, that there is a fault in the current loop when the voltage on the current loop is outside of an expected range.

In some aspects, the power source includes: an AC-DC conversion circuit coupled to an AC power supply that converts AC power to DC power.

In some aspects, the apparatus further includes: an isolation circuit coupled to an output of the AC-DC conversion circuit and configured to provide isolation for both voltage and ground.

In some aspects, the controller is further configured to generate the control for connectivity of the power by terminating operation of a pulse control signal to the isolation circuit used to perform pulse power from the AC-DC conversion circuit to the current loop.

Power Receiver Side Aspects

In some aspects, the techniques described herein relate to a method performed at a power receiver that receives power over a current loop from a power transmitter, the method including: receiving power from the current loop; and on a periodic basis, disconnecting the power receiver from the current loop to stop pulling current from the current loop for a period of time.

In some aspects, disconnecting is performed on the periodic basis to enable the power transmitter to perform a safety check on the current loop.

In some aspects, the power is direct current (DC) power.

In some aspects, the power is alternating current (AC) power.

In some aspects, disconnecting includes disconnecting the power receiver from the current loop for the period of time that encompasses a particular portion of an AC waveform of the AC power.

In some aspects, the particular portion is a zero crossing of the AC waveform.

In some aspects, disconnecting includes disconnecting the power receiver from the current loop for multiple different periods of time that encompass corresponding multiple different portions of an AC waveform of the AC power. In some aspects, the multiple different portions of the AC waveform includes a first portion that encompasses a zero crossing of the AC waveform and a second portion that encompasses a peak of the AC waveform.

In some aspects, the method further includes, at a controller of the power receiver, controlling the disconnecting from the current loop based on a modulation frequency.

In some aspects, the method further includes adjusting the modulation frequency to spread a frequency of energy associated with current pulses which result from the disconnecting from the current loop.

In some aspects, the techniques described herein relate to an apparatus including: at least one disconnect coupled to a current loop that provides power from a power transmitter coupled to the current loop; and a controller coupled to the at least one disconnect, wherein the controller is configured to control the at least one disconnect to periodically disconnect from the current loop for a period of time.

In some aspects, the power is direct current (DC) power or alternating current (AC) power.

In some aspects, the controller is configured to control the at least one disconnect to disconnect from the current loop for the period of time that encompasses a particular portion of an AC waveform of the AC power.

In some aspects, the controller is configured to control the at least one disconnect to disconnect the power from the current loop for multiple different periods of time that encompass corresponding multiple different portions of an AC waveform of the AC power.

Fault Managed Power System Aspects

In some aspects, the techniques described herein relate to a system including: a power transmitter configured to provide power to a current loop; and a power receiver configured to receive the power from the current loop; wherein the power receiver is configured to, on a periodic basis, disconnect from the current loop to stop pulling power from the current loop for a period of time to enable a safety check to be performed by the power transmitter; wherein the power transmitter is configured to: monitor current on the current loop; determine whether a current level on the current loop passes the safety check within a predetermined time interval since a determination that the current level was not within a safe range; and control connectivity of the power to the current loop depending on whether the safety check has or has not passed within the predetermined time interval.

In some aspects, the power transmitter is configured to determine whether the current level passes the safety check by: determining whether the current level is less than a predetermined safety threshold corresponding to the safe range; and declaring the safety check passes when the current level is less than the predetermined safety threshold.

In some aspects, the power is direct current (DC) power or alternating current (AC) power.

In some aspects, the power transmitter is configured to control connectivity of the power to the current loop by one of: generating a control to disconnect the power coupled to the current loop when it is determined that the safety check has not passed within the predetermined time interval; or generating a control to maintain connectivity of the power to the current loop if it is determined that the safety check has passed within the predetermined time interval.

In some aspects, the power receiver is configured to control disconnecting from the current loop based on a modulation frequency.

In some aspects, the power receiver is configured to adjust the modulation frequency to spread a frequency of energy associated with current pulses which result from disconnecting from the current loop.

In some aspects, the techniques described herein relate to a system including: an alternating current to direct current (AC-DC) conversion circuit coupled to an AC power supply that converts AC power to DC power; a plurality of power transmitters, each configured to output power to a corresponding current loop of a plurality of current loops, wherein each power transmitter is configured to determine whether a current level on the corresponding current loop passes a safety check within a predetermined time interval since a determination that the current level was not within a safe range, and to control connectivity of power to the corresponding current loop depending on whether the safety check has or has not passed within the predetermined time interval; a plurality of isolation circuits each of which is coupled between the AC-DC conversion circuit and a respective one of the plurality of power transmitters; and a plurality of power receivers, each coupled to a corresponding current loop of the plurality of current loops, wherein each power receiver is configured to, on a periodic basis, disconnect from the corresponding current loop to stop pulling power from the corresponding current loop for a period of time to enable a safety check to be performed by the power transmitter.

In some aspects, the system further includes: a plurality of electromagnetic compatibility filters, each of which is coupled between an output of a corresponding power transmitter of the plurality of power transmitters and the corresponding current loop of the plurality of current loops.

In some aspects, each of the plurality of power transmitters includes: at least one current sensor coupled to a respective line of a corresponding current loop to sense current on the respective line of the corresponding current loop; and a controller coupled to the at least one current sensor, wherein the controller is configured to: determine whether a current level on the corresponding current loop passes a safety check within a predetermined time interval since a determination that the current level was not within a safe range; and generate a control for connectivity of the power to the corresponding current loop depending on whether the safety check has or has not passed within the predetermined time interval.

In some aspects, the controller of each power transmitter is configured to generate the control for connectivity of the power to the corresponding current loop by one of: generating a control to disconnect the power coupled to the corresponding current loop when it is determined that the safety check has not passed within the predetermined time interval; or generating a control to maintain connectivity of the power to the corresponding current loop if it is determined that the safety check has passed within the predetermined time interval.

In some aspects, the controller of each power transmitter is configured to determine whether the current level passes the safety check by: determining whether the current level is less than a predetermined safety threshold corresponding to the safe range; and declaring the safety check passes when the current level is less than the predetermined safety threshold.

In some aspects, controller of each power transmitter is further configured to generate the control for connectivity of the power by terminating operation of a pulse control signal to a corresponding isolation circuit used to perform pulse power from the AC-DC conversion circuit to the corresponding current loop.

In some aspects, each power receiver is configured to control disconnecting from the corresponding current loop based on a modulation frequency.

In some aspects, each power receiver is configured to adjust the modulation frequency to spread a frequency of energy associated with current pulses which result from disconnecting from the corresponding current loop.

In some aspects, the techniques described herein relate to a system including: an alternating current to direct current (AC-DC) conversion circuit coupled to an AC power supply that converts AC power to DC power; a plurality of power transmitters, each configured to output power to a corresponding current loop of a plurality of current loops, wherein each power transmitter is configured to determine whether a current level on the corresponding current loop passes a safety check within a predetermined time interval since a determination that the current level was not within a safe range, and to control connectivity of power to the corresponding current loop depending on whether the safety check has or has not passed within the predetermined time interval; and a plurality of isolation circuits each of which is coupled between the AC-DC conversion circuit and a respective one of the plurality of power transmitters.

In some aspects, the system further includes: a plurality of electromagnetic compatibility filters, each of which is coupled between an output of a corresponding power transmitter of the plurality of power transmitters and the corresponding current loop of the plurality of current loops.

In some aspects, each of the plurality of power transmitters includes: at least one current sensor coupled to a respective line of a corresponding current loop to sense current on the respective line of the corresponding current loop; and a controller coupled to the at least one current sensor, wherein the controller is configured to: determine whether a current level on the corresponding current loop passes a safety check within a predetermined time interval since a determination that the current level was not within a safe range; and generate a control for connectivity of the power to the corresponding current loop depending on whether the safety check has or has not passed within the predetermined time interval.

In some aspects, the controller of each power transmitter is configured to generate the control for connectivity of the power to the corresponding current loop by one of: generating a control to disconnect the power coupled to the corresponding current loop when it is determined that the safety check has not passed within the predetermined time interval; or generating a control to maintain connectivity of the power to the corresponding current loop if it is determined that the safety check has passed within the predetermined time interval.

In some aspects, the controller of each power transmitter is configured to determine whether the current level passes the safety check by: determining whether the current level is less than a predetermined safety threshold corresponding to the safe range; and declaring the safety check passes when the current level is less than the predetermined safety threshold.

In some aspects, the controller of each power transmitter is further configured to generate the control for connectivity of the power by terminating operation of a pulse control signal to a corresponding isolation circuit used to perform pulse power from the AC-DC conversion circuit to the corresponding current loop.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

The aforementioned controller that is resident in the power transmitter (as shown in FIGS. 5, 9A and 9B) and in the power transceiver (as shown in FIGS. 6A and 6B) may take on a variety of forms, to perform the various power transmitter and power receiver operations disclosed herein (including those operations depicted in FIGS. 7 and 8, respectively).

In at least one embodiment, the controller may be at least one hardware processor configured to execute various tasks, operations and/or functions as described herein according to software and/or instructions configured for computing device. Such a processor(s) (e.g., a hardware processor) can execute any type of instructions associated with data to achieve the operations detailed herein. In one example, processor(s) can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, a memory element(s) and/or storage may be associated with the processor to store data, information, software, and/or instructions associated with the operations performed by the processor. For example, any logic described herein (e.g., control logic) can, in various embodiments, be stored using any combination of memory element(s) and/or storage. Note that in some embodiments, storage can be consolidated with memory element(s) (or vice versa), or can overlap/exist in any other suitable manner.

In at least one embodiment, a bus can be configured as an interface that enables one or more elements of processor to communicate in order to exchange information and/or data. The bus can be implemented with any architecture designed for passing control, data and/or information between processors, memory elements/storage, peripheral devices, and/or any other hardware and/or software components.

In various embodiments, control logic executed by the controller can include instructions that, when executed, cause processor(s) to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, any entity or apparatus as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) and/or storage can store data, software, code, instructions (e.g., processor instructions), logic, parameters, combinations thereof, and/or the like used for operations described herein. This includes memory element(s) and/or storage being able to store data, software, code, instructions (e.g., processor instructions), logic, parameters, combinations thereof, or the like that are executed to carry out operations in accordance with teachings of the present disclosure.

In this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A system comprising:
an alternating current to direct current (AC-DC) conversion circuit coupled to an AC power supply that converts AC power to DC power;
a power transmitter configured to provide power to a current loop;
an isolation circuit coupled between the AC-DC conversion circuit and the power transmitter; and
a power receiver configured to receive the power from the current loop;
wherein the power receiver is configured to, on a periodic basis, disconnect from the current loop to stop pulling power from the current loop for a period of time to enable a safety check to be performed by the power transmitter;
wherein the power transmitter is configured to:
monitor current on the current loop;
determine whether a current level on the current loop passes the safety check within a predetermined time interval since a determination that the current level was not within a safe range; and
control connectivity of the power to the current loop depending on whether the safety check has or has not passed within the predetermined time interval by terminating operation of a pulse control signal to the isolation circuit to provide pulse power from the AC-DC conversion circuit to the current loop.

2. The system of claim 1, wherein the power transmitter is configured to determine whether the current level passes the safety check by:
determining whether the current level is less than a predetermined safety threshold corresponding to the safe range; and
declaring the safety check passes when the current level is less than the predetermined safety threshold.

3. The system of claim 1, further comprising an electromagnetic compatibility filter coupled between an output of the power transmitters and the current loop.

4. The system of claim 1, wherein the power transmitter is configured to control connectivity of the power to the current loop by one of: generating a control to disconnect the power coupled to the current loop when it is determined that the safety check has not passed within the predetermined time interval; or generating a control to maintain connectivity of the power to the current loop if it is determined that the safety check has passed within the predetermined time interval.

5. The system of claim 1, wherein the power receiver is configured to control disconnecting from the current loop based on a modulation frequency.

6. The system of claim 5, wherein the power receiver is configured to adjust the modulation frequency to spread a frequency of energy associated with current pulses which result from disconnecting from the current loop.

7. A system comprising:
an alternating current to direct current (AC-DC) conversion circuit coupled to an AC power supply that converts AC power to DC power;
a plurality of power transmitters, each configured to output power to a corresponding current loop of a plurality of current loops, wherein each power transmitter is configured to determine whether a current level on the corresponding current loop passes a safety check within a predetermined time interval since a determination that the current level was not within a safe range, and to control connectivity of power to the corresponding current loop depending on whether the safety check has or has not passed within the predetermined time interval;
a plurality of isolation circuits each of which is coupled between the AC-DC conversion circuit and a respective one of the plurality of power transmitters; and
a plurality of power receivers, each coupled to a corresponding current loop of the plurality of current loops, wherein each power receiver is configured to, on a periodic basis, disconnect from the corresponding current loop to stop pulling power from the corresponding current loop for a period of time to enable a safety check to be performed by the power transmitter coupled to the corresponding current loop.

8. The system of claim 7, further comprising:
a plurality of electromagnetic compatibility filters, each of which is coupled between an output of a corresponding power transmitter of the plurality of power transmitters and the corresponding current loop of the plurality of current loops.

9. The system of claim 7, wherein each of the plurality of power transmitters comprises:
at least one current sensor coupled to a respective line of a corresponding current loop to sense current on the respective line of the corresponding current loop; and
a controller coupled to the at least one current sensor, wherein the controller is configured to:
determine whether a current level on the corresponding current loop passes a safety check within a predetermined time interval since a determination that the current level was not within a safe range; and
generate a control for connectivity of the power to the corresponding current loop depending on whether the safety check has or has not passed within the predetermined time interval.

10. The system of claim 9, wherein the controller of each power transmitter is configured to generate the control for connectivity of the power to the corresponding current loop by one of: generating a control to disconnect the power coupled to the corresponding current loop when it is determined that the safety check has not passed within the predetermined time interval; or generating a control to maintain connectivity of the power to the corresponding current loop if it is determined that the safety check has passed within the predetermined time interval.

11. The system of claim 9, wherein the controller of each power transmitter is configured to determine whether the current level passes the safety check by:
determining whether the current level is less than a predetermined safety threshold corresponding to the safe range; and
declaring the safety check passes when the current level is less than the predetermined safety threshold.

12. The system of claim 9, wherein the controller of each power transmitter is further configured to generate the control for connectivity of the power by terminating operation of a pulse control signal to a corresponding isolation circuit used to perform pulse power from the AC-DC conversion circuit to the corresponding current loop.

13. The system of claim 7, wherein each power receiver is configured to control disconnecting from the corresponding current loop based on a modulation frequency.

14. The system of claim 13, wherein each power receiver is configured to adjust the modulation frequency to spread a frequency of energy associated with current pulses which result from disconnecting from the corresponding current loop.

15. A system comprising:
an alternating current to direct current (AC-DC) conversion circuit coupled to an AC power supply that converts AC power to DC power;
a plurality of power transmitters, each configured to output power to a corresponding current loop of a plurality of current loops, wherein each power transmitter is configured to determine whether a current level on the corresponding current loop passes a safety check within a predetermined time interval since a determination that the current level was not within a safe range, and to control connectivity of power to the corresponding current loop depending on whether the safety check has or has not passed within the predetermined time interval; and
a plurality of isolation circuits each of which is coupled between the AC-DC conversion circuit and a respective one of the plurality of power transmitters.

16. The system of claim 15, further comprising:
a plurality of electromagnetic compatibility filters, each of which is coupled between an output of a corresponding power transmitter of the plurality of power transmitters and the corresponding current loop of the plurality of current loops.

17. The system of claim 15, wherein each of the plurality of power transmitters comprises:
at least one current sensor coupled to a respective line of a corresponding current loop to sense current on the respective line of the corresponding current loop; and
a controller coupled to the at least one current sensor, wherein the controller is configured to:
determine whether a current level on the corresponding current loop passes a safety check within a predetermined time interval since a determination that the current level was not within a safe range; and
generate a control for connectivity of the power to the corresponding current loop depending on whether the safety check has or has not passed within the predetermined time interval.

18. The system of claim 17, wherein the controller of each power transmitter is configured to generate the control for connectivity of the power to the corresponding current loop by one of: generating a control to disconnect the power coupled to the corresponding current loop when it is determined that the safety check has not passed within the predetermined time interval; or generating a control to maintain connectivity of the power to the corresponding current loop if it is determined that the safety check has passed within the predetermined time interval.

19. The system of claim 17, wherein the controller of each power transmitter is configured to determine whether the current level passes the safety check by:
determining whether the current level is less than a predetermined safety threshold corresponding to the safe range; and
declaring the safety check passes when the current level is less than the predetermined safety threshold.

20. The system of claim 17, wherein the controller of each power transmitter is further configured to generate the control for connectivity of the power by terminating operation of a pulse control signal to a corresponding isolation circuit used to perform pulse power from the AC-DC conversion circuit to the corresponding current loop.

* * * * *